US011072706B2

(12) United States Patent
Shen et al.

(10) Patent No.: US 11,072,706 B2
(45) Date of Patent: Jul. 27, 2021

(54) GEL-TYPE THERMAL INTERFACE MATERIAL

(71) Applicant: Honeywell International Inc., Morris Plains, NJ (US)

(72) Inventors: Ling Shen, Shanghai (CN); Kai Zhang, Shanghai (CN); Liqiang Zhang, Shanghai (CN); Ya Qun Liu, Shanghai (CN); Xin Zhang, Shanghai (CN)

(73) Assignee: Honeywell International Inc., Charlotte, NC (US)

( * ) Notice: Subject to any disclaimer, the term of this patent is extended or adjusted under 35 U.S.C. 154(b) by 167 days.

(21) Appl. No.: 16/267,056

(22) Filed: Feb. 4, 2019

(65) Prior Publication Data

US 2019/0249007 A1    Aug. 15, 2019

Related U.S. Application Data

(60) Provisional application No. 62/630,928, filed on Feb. 15, 2018.

(51) Int. Cl.
| | | |
|---|---|---|
| *C08K 3/22* | (2006.01) | |
| *C08L 83/04* | (2006.01) | |
| *C09K 5/08* | (2006.01) | |
| *H01L 23/373* | (2006.01) | |
| *H01L 23/42* | (2006.01) | |
| C08G 77/20 | (2006.01) | |

(52) U.S. Cl.
CPC ............... *C08L 83/04* (2013.01); *C08K 3/22* (2013.01); *C09K 5/08* (2013.01); *H01L 23/3737* (2013.01); *H01L 23/42* (2013.01); C08G 77/20 (2013.01); C08K 2003/2227 (2013.01); C08K 2201/006 (2013.01); C08L 2201/56 (2013.01); C08L 2203/20 (2013.01)

(58) Field of Classification Search
CPC ........ C08K 2201/006; C08K 2201/001; C08K 3/22; C08K 2003/2227
See application file for complete search history.

(56) References Cited

U.S. PATENT DOCUMENTS

| | | | |
|---|---|---|---|
| 1,655,133 A | 1/1928 | Clase | |
| 2,451,600 A | 10/1948 | Woodcock | |
| 2,810,203 A | 10/1957 | Bachofer | |
| 3,262,997 A | 7/1966 | Cameron et al. | |
| 4,006,530 A | 2/1977 | Nicolas | |
| 4,087,918 A | 5/1978 | Schmid et al. | |
| 4,180,498 A | 12/1979 | Spivack | |
| 4,265,026 A | 5/1981 | Meyer | |
| 4,446,266 A | 5/1984 | von Gentzkow et al. | |
| 4,459,185 A | 7/1984 | Obata et al. | |
| 4,559,709 A | 12/1985 | Beseme et al. | |
| 4,565,610 A | 1/1986 | Nobel et al. | |
| 4,604,424 A | 8/1986 | Cole et al. | |
| 4,787,149 A | 11/1988 | Possati et al. | |
| 4,816,086 A | 3/1989 | Oleske | |
| 4,832,781 A | 5/1989 | Mears | |
| 4,839,955 A | 6/1989 | Vannier | |
| 4,910,050 A | 3/1990 | Oldham et al. | |
| 5,162,555 A | 11/1992 | Remmers et al. | |
| 5,167,851 A | 12/1992 | Jamison et al. | |
| 5,294,923 A | 3/1994 | Juergens et al. | |
| 5,391,924 A | 2/1995 | Uchida et al. | |
| 5,403,580 A | 4/1995 | Bujanowski et al. | |
| 5,562,814 A | 10/1996 | Kirby | |
| 5,660,917 A | 8/1997 | Fujimori et al. | |
| 5,816,699 A | 10/1998 | Keith et al. | |
| 5,930,115 A | 7/1999 | Tracy et al. | |
| 5,950,066 A | 9/1999 | Hanson et al. | |
| 6,040,362 A | 3/2000 | Mine et al. | |
| 6,054,198 A | 4/2000 | Bunyan et al. | |
| 6,090,484 A | 7/2000 | Bergerson | |
| 6,096,414 A * | 8/2000 | Young .................... | C08K 3/22 428/220 |
| 6,165,612 A | 12/2000 | Misra | |
| 6,197,859 B1 | 3/2001 | Hanson et al. | |
| 6,238,596 B1 | 5/2001 | Nguyen et al. | |
| 6,339,120 B1 | 1/2002 | Misra et al. | |
| 6,372,337 B2 | 4/2002 | Takahashi et al. | |

(Continued)

FOREIGN PATENT DOCUMENTS

| | | |
|---|---|---|
| CA | 2311067 A1 | 1/2001 |
| CA | 2433637 A1 | 12/2002 |

(Continued)

OTHER PUBLICATIONS

Silicone Fluid KF-96 data sheet, 2021.*
English language translation JP 2009-209230, Sep. 2009.*
Phase Change Material: DAPCM80-1"\MH&W International Corp., May 2012, http://mhw-thermal.com, 1 pages.
Extended European Search Report issued in EP Application 15749120.0, dated Aug. 11, 2017, 6 pages.
International Search Report and Written Opinion issued in PCT/CN2015/072202, dated Apr. 29, 2015, 14 pages.
International Preliminary Report on Patentability received for PCT Patent Application No. PCT/US17/41447, dated Feb. 7, 2019, 8 pages.
International Search Report and Written Opinion issued in PCT/US2009/069090, dated Aug. 17, 2010, 6 pages.

(Continued)

*Primary Examiner* — Margaret G Moore
(74) *Attorney, Agent, or Firm* — Faegre Drinker Biddle & Reath LLP

(57) ABSTRACT

A thermal interface material that is useful in transferring heat from heat generating electronic devices, such as computer chips, to heat dissipating structures, such as heat spreaders and heat sinks. The thermal interface material comprises at least one silicone oil, at least one catalyst, at least one thermally conductive filler having a larger surface area, a solvent, at least one inhibitor, and at least one crosslinker. The at least one thermally conductive filler reduces the oil leakage of the TIM, and the solvent increases the flow rate of the TIM without negating the reduction of oil leakage realized by the thermally conductive fillers.

18 Claims, 5 Drawing Sheets

(56) References Cited

U.S. PATENT DOCUMENTS

| | | |
|---|---|---|
| 6,372,997 B1 | 4/2002 | Hill et al. |
| 6,391,442 B1 | 5/2002 | Duvall et al. |
| 6,400,565 B1 | 6/2002 | Shabbir et al. |
| 6,432,320 B1 | 8/2002 | Bonsignore et al. |
| 6,432,497 B2 | 8/2002 | Bunyan |
| 6,451,422 B1 | 9/2002 | Nguyen |
| 6,475,962 B1 | 11/2002 | Khatri |
| 6,496,373 B1 | 12/2002 | Chung |
| 6,500,891 B1 | 12/2002 | Kropp et al. |
| 6,506,332 B2 | 1/2003 | Pedigo |
| 6,562,180 B1 | 5/2003 | Bohin et al. |
| 6,597,575 B1 | 7/2003 | Matayabas et al. |
| 6,605,238 B2 | 8/2003 | Nguyen et al. |
| 6,610,635 B2 | 8/2003 | Khatri |
| 6,616,999 B1 | 9/2003 | Freuler et al. |
| 6,617,517 B2 | 9/2003 | Hill et al. |
| 6,620,515 B2 | 9/2003 | Feng et al. |
| 6,624,224 B1 | 9/2003 | Misra |
| 6,645,643 B2 | 11/2003 | Zafarana et al. |
| 6,649,325 B1 | 11/2003 | Gundale et al. |
| 6,657,297 B1 | 12/2003 | Jewram et al. |
| 6,673,434 B2 | 1/2004 | Nguyen |
| 6,706,219 B2 | 3/2004 | Nguyen |
| 6,761,928 B2 | 7/2004 | Hill et al. |
| 6,764,759 B2 | 7/2004 | Duvall et al. |
| 6,783,692 B2 | 8/2004 | Bhagwagar |
| 6,791,839 B2 | 9/2004 | Bhagwagar |
| 6,797,382 B2 | 9/2004 | Nguyen et al. |
| 6,797,758 B2 | 9/2004 | Misra et al. |
| 6,811,725 B2 | 11/2004 | Nguyen et al. |
| 6,815,486 B2 | 11/2004 | Bhagwagar et al. |
| 6,835,453 B2 | 12/2004 | Greenwood et al. |
| 6,838,182 B2 | 1/2005 | Kropp et al. |
| 6,841,757 B2 | 1/2005 | Marega et al. |
| 6,874,573 B2 | 4/2005 | Collins et al. |
| 6,900,163 B2 | 5/2005 | Khatri |
| 6,901,675 B2 | 6/2005 | Edwards et al. |
| 6,908,669 B2 | 6/2005 | Nguyen |
| 6,908,682 B2 | 6/2005 | Mistele |
| 6,913,686 B2 | 7/2005 | Hilgarth |
| 6,921,780 B2 | 7/2005 | Ducros et al. |
| 6,924,027 B2 | 8/2005 | Matayabas et al. |
| 6,926,955 B2 | 8/2005 | Jayaraman et al. |
| 6,940,721 B2 | 9/2005 | Hill |
| 6,946,190 B2 | 9/2005 | Bunyan |
| 6,956,739 B2 | 10/2005 | Bunyan |
| 6,975,944 B1 | 12/2005 | Zenhausern |
| 6,984,685 B2 | 1/2006 | Misra et al. |
| 7,013,965 B2 | 3/2006 | Zhong et al. |
| 7,038,009 B2 | 5/2006 | Sagal et al. |
| 7,056,566 B2 | 6/2006 | Freuler et al. |
| 7,074,490 B2 | 7/2006 | Feng et al. |
| 7,078,109 B2 | 7/2006 | Hill et al. |
| 7,119,143 B2 | 10/2006 | Jarnjevic et al. |
| 7,135,232 B2 | 11/2006 | Yamada et al. |
| 7,147,367 B2 | 12/2006 | Balian et al. |
| 7,172,711 B2 | 2/2007 | Nguyen |
| 7,208,191 B2 | 4/2007 | Freedman |
| 7,241,707 B2 | 7/2007 | Meagley et al. |
| 7,244,491 B2 | 7/2007 | Nguyen |
| 7,253,523 B2 | 8/2007 | Dani et al. |
| 7,262,369 B1 | 8/2007 | English |
| 7,291,396 B2 | 11/2007 | Huang et al. |
| 7,294,394 B2 | 11/2007 | Jayaraman et al. |
| RE39,992 E | 1/2008 | Misra et al. |
| 7,326,042 B2 | 2/2008 | Alper et al. |
| 7,328,547 B2 | 2/2008 | Mehta et al. |
| 7,369,411 B2 | 5/2008 | Hill et al. |
| 7,440,281 B2 | 10/2008 | Bailey et al. |
| 7,446,158 B2 | 11/2008 | Okamoto et al. |
| 7,462,294 B2 | 12/2008 | Kumar et al. |
| 7,463,496 B2 | 12/2008 | Robinson et al. |
| 7,465,605 B2 | 12/2008 | Raravikar et al. |
| 7,538,075 B2 | 5/2009 | Yamada et al. |
| 7,550,097 B2 | 6/2009 | Tonapi et al. |
| 7,572,494 B2 | 8/2009 | Mehta et al. |
| 7,608,324 B2 | 10/2009 | Nguyen et al. |
| 7,641,811 B2 | 1/2010 | Kumar et al. |
| 7,646,778 B2 | 1/2010 | Sajassi |
| 7,682,690 B2 | 3/2010 | Bunyan et al. |
| 7,695,817 B2 | 4/2010 | Lin et al. |
| 7,700,943 B2 | 4/2010 | Raravikar et al. |
| 7,732,829 B2 | 6/2010 | Murphy |
| 7,744,991 B2 | 6/2010 | Fischer et al. |
| 7,763,673 B2 | 7/2010 | Okamoto et al. |
| RE41,576 E | 8/2010 | Bunyan et al. |
| 7,765,811 B2 | 8/2010 | Hershberger et al. |
| 7,807,756 B2 | 10/2010 | Wakabayashi et al. |
| 7,816,785 B2 | 10/2010 | Iruvanti et al. |
| 7,842,381 B2 | 11/2010 | Johnson |
| 7,846,778 B2 | 12/2010 | Rumer et al. |
| 7,850,870 B2 | 12/2010 | Ahn et al. |
| 7,867,609 B2 | 1/2011 | Nguyen |
| 7,893,170 B2 | 2/2011 | Wakioka et al. |
| 7,955,900 B2 | 6/2011 | Jadhav et al. |
| 7,960,019 B2 | 6/2011 | Jayaraman et al. |
| 7,973,108 B2 | 7/2011 | Okamoto et al. |
| 8,009,429 B1 | 8/2011 | Sundstrom et al. |
| 8,039,961 B2 | 10/2011 | Suhir et al. |
| 8,076,773 B2 | 12/2011 | Jewram et al. |
| 8,081,468 B2 | 12/2011 | Hill et al. |
| 8,093,331 B2 * | 1/2012 | Fukui .................... C08L 83/04 524/588 |
| 8,102,058 B2 | 1/2012 | Hsieh et al. |
| 8,105,504 B2 | 1/2012 | Gerster et al. |
| 8,110,919 B2 | 2/2012 | Jewram et al. |
| 8,112,884 B2 | 2/2012 | Tullidge et al. |
| 8,115,303 B2 | 2/2012 | Bezama et al. |
| 8,138,239 B2 | 3/2012 | Prack et al. |
| 8,167,463 B2 | 5/2012 | Loh |
| 8,223,498 B2 | 7/2012 | Lima |
| 8,308,861 B2 | 11/2012 | Rolland et al. |
| 8,324,313 B2 | 12/2012 | Funahashi |
| 8,362,607 B2 | 1/2013 | Scheid et al. |
| 8,373,283 B2 | 2/2013 | Masuko et al. |
| 8,431,647 B2 | 4/2013 | Dumont et al. |
| 8,431,655 B2 | 4/2013 | Dershem |
| 8,445,102 B2 | 5/2013 | Strader et al. |
| 8,518,302 B2 | 8/2013 | Gerster et al. |
| 8,535,478 B2 | 9/2013 | Pouchelon et al. |
| 8,535,787 B1 | 9/2013 | Lima |
| 8,557,896 B2 | 10/2013 | Jeong et al. |
| 8,586,650 B2 | 11/2013 | Zhang et al. |
| 8,587,945 B1 | 11/2013 | Hartmann et al. |
| 8,618,211 B2 | 12/2013 | Bhagwagar et al. |
| 8,632,879 B2 | 1/2014 | Weisenberger |
| 8,633,478 B2 | 1/2014 | Cummings et al. |
| 8,638,001 B2 | 1/2014 | Kimura et al. |
| 8,647,752 B2 | 2/2014 | Strader et al. |
| 8,758,892 B2 | 6/2014 | Bergin et al. |
| 8,796,068 B2 | 8/2014 | Stender et al. |
| 8,837,151 B2 | 9/2014 | Hill et al. |
| 8,865,800 B2 | 10/2014 | Stammer et al. |
| 8,917,510 B2 | 12/2014 | Boday et al. |
| 8,937,384 B2 | 1/2015 | Bao et al. |
| 9,055,694 B2 | 6/2015 | Lima |
| 9,070,660 B2 | 6/2015 | Lowe et al. |
| 9,080,000 B2 | 7/2015 | Ahn et al. |
| 9,222,735 B2 | 12/2015 | Hill et al. |
| 9,260,645 B2 | 2/2016 | Bruzda |
| 9,353,304 B2 | 5/2016 | Merrill et al. |
| 9,392,730 B2 | 7/2016 | Hartmann et al. |
| 9,481,851 B2 | 11/2016 | Matsumoto et al. |
| 9,527,988 B2 | 12/2016 | Habimana et al. |
| 9,537,095 B2 | 1/2017 | Stender et al. |
| 9,593,209 B2 | 3/2017 | Dent et al. |
| 9,593,275 B2 | 3/2017 | Tang et al. |
| 9,598,575 B2 | 3/2017 | Bhagwagar et al. |
| 10,155,894 B2 | 12/2018 | Liu et al. |
| 10,287,471 B2 | 5/2019 | Zhang et al. |
| 10,312,177 B2 | 6/2019 | Zhang et al. |
| 10,501,671 B2 | 12/2019 | Zhang et al. |
| 10,781,349 B2 | 9/2020 | Zhang et al. |
| 2002/0018885 A1 | 2/2002 | Takahashi et al. |

(56) References Cited

U.S. PATENT DOCUMENTS

| | | |
|---|---|---|
| 2002/0132896 A1 | 9/2002 | Nguyen |
| 2002/0140082 A1 | 10/2002 | Matayabas |
| 2002/0143092 A1 | 10/2002 | Matayabas |
| 2003/0031876 A1 | 2/2003 | Obeng et al. |
| 2003/0068487 A1 | 4/2003 | Nguyen et al. |
| 2003/0112603 A1 | 6/2003 | Roesner et al. |
| 2003/0128521 A1 | 7/2003 | Matayabas et al. |
| 2003/0151030 A1 | 8/2003 | Gurin |
| 2003/0159938 A1 | 8/2003 | Hradil |
| 2003/0171487 A1 | 9/2003 | Ellsworth et al. |
| 2003/0178139 A1 | 9/2003 | Clouser et al. |
| 2003/0203181 A1 | 10/2003 | Ellsworth et al. |
| 2003/0207064 A1 | 11/2003 | Bunyan et al. |
| 2003/0207128 A1 | 11/2003 | Uchiya et al. |
| 2003/0230403 A1 | 12/2003 | Webb |
| 2004/0037965 A1 | 2/2004 | Salter |
| 2004/0053059 A1 | 3/2004 | Mistele |
| 2004/0069454 A1 | 4/2004 | Bonsignore et al. |
| 2004/0097635 A1 | 5/2004 | Fan et al. |
| 2004/0149587 A1 | 8/2004 | Hradil |
| 2004/0161571 A1 | 8/2004 | Duvall et al. |
| 2004/0206941 A1 | 10/2004 | Gurin |
| 2005/0020738 A1 | 1/2005 | Jackson et al. |
| 2005/0025984 A1 | 2/2005 | Odell et al. |
| 2005/0045855 A1 | 3/2005 | Tonapi et al. |
| 2005/0072334 A1 | 4/2005 | Czubarow et al. |
| 2005/0110133 A1 | 5/2005 | Yamada et al. |
| 2005/0148721 A1 | 7/2005 | Tonapi et al. |
| 2005/0228097 A1 | 10/2005 | Zhong |
| 2005/0256291 A1 | 11/2005 | Okamoto et al. |
| 2005/0287362 A1 | 12/2005 | Garcia-Ramirez et al. |
| 2006/0040112 A1 | 2/2006 | Dean et al. |
| 2006/0057364 A1 | 3/2006 | Nguyen |
| 2006/0094809 A1 | 5/2006 | Simone et al. |
| 2006/0122304 A1 | 6/2006 | Matayabas |
| 2006/0155029 A1 | 7/2006 | Zucker |
| 2006/0208354 A1 | 9/2006 | Liu et al. |
| 2006/0228542 A1 | 10/2006 | Czubarow |
| 2006/0260948 A2 | 11/2006 | Zschintzsch et al. |
| 2006/0264566 A1 | 11/2006 | Cassar et al. |
| 2007/0013054 A1 | 1/2007 | Ruchert et al. |
| 2007/0051773 A1 | 3/2007 | Ruchert et al. |
| 2007/0097651 A1 | 5/2007 | Canale et al. |
| 2007/0116626 A1 | 5/2007 | Pan et al. |
| 2007/0131913 A1 | 6/2007 | Cheng et al. |
| 2007/0161521 A1 | 7/2007 | Sachdev et al. |
| 2007/0164424 A1 | 7/2007 | Dean et al. |
| 2007/0166554 A1 | 7/2007 | Ruchert et al. |
| 2007/0179232 A1 | 8/2007 | Collins et al. |
| 2007/0219312 A1 | 9/2007 | David |
| 2007/0241303 A1 | 10/2007 | Zhong et al. |
| 2007/0241307 A1 | 10/2007 | Nguyen |
| 2007/0249753 A1 | 10/2007 | Lin et al. |
| 2007/0293604 A1 | 12/2007 | Frenkel et al. |
| 2008/0021146 A1 | 1/2008 | Komatsu et al. |
| 2008/0023665 A1 | 1/2008 | Weiser et al. |
| 2008/0044670 A1 | 2/2008 | Nguyen |
| 2008/0110609 A1 | 5/2008 | Fann et al. |
| 2008/0116416 A1 | 5/2008 | Chacko |
| 2008/0141629 A1 | 6/2008 | Alper et al. |
| 2008/0149176 A1 | 6/2008 | Sager et al. |
| 2008/0269405 A1 | 10/2008 | Okamoto et al. |
| 2008/0291634 A1 | 11/2008 | Weiser et al. |
| 2008/0302064 A1 | 12/2008 | Rauch |
| 2009/0053515 A1 | 2/2009 | Luo et al. |
| 2009/0072408 A1 | 3/2009 | Kabir et al. |
| 2009/0111925 A1 | 4/2009 | Burnham et al. |
| 2009/0184283 A1 | 7/2009 | Chung et al. |
| 2010/0040768 A1 | 2/2010 | Dhindsa |
| 2010/0048435 A1 | 2/2010 | Yamagata et al. |
| 2010/0048438 A1 | 2/2010 | Carey et al. |
| 2010/0075135 A1 | 3/2010 | Kendall et al. |
| 2010/0129648 A1 | 5/2010 | Xu et al. |
| 2010/0197533 A1 | 8/2010 | Kendall et al. |
| 2010/0256280 A1 | 10/2010 | Bruzda |
| 2010/0304152 A1 | 12/2010 | Clarke |
| 2011/0000516 A1 | 1/2011 | Hershberger et al. |
| 2011/0038124 A1 | 2/2011 | Burnham et al. |
| 2011/0121435 A1 | 5/2011 | Mitsukura et al. |
| 2011/0141698 A1 | 6/2011 | Chiou et al. |
| 2011/0187009 A1 | 8/2011 | Masuko et al. |
| 2011/0192564 A1 | 8/2011 | Mommer et al. |
| 2011/0204280 A1 | 8/2011 | Bruzda |
| 2011/0205708 A1 | 8/2011 | Andry et al. |
| 2011/0265979 A1 | 11/2011 | Chen et al. |
| 2011/0294958 A1 | 12/2011 | Ahn et al. |
| 2011/0308782 A1 | 12/2011 | Merrill et al. |
| 2012/0048528 A1 | 3/2012 | Bergin et al. |
| 2012/0060826 A1 | 3/2012 | Weisenberger |
| 2012/0087094 A1 | 4/2012 | Hill et al. |
| 2012/0142832 A1 | 6/2012 | Varma et al. |
| 2012/0174956 A1 | 7/2012 | Smythe et al. |
| 2012/0182693 A1 | 7/2012 | Boday et al. |
| 2012/0195822 A1 | 8/2012 | Werner et al. |
| 2012/0253033 A1 | 10/2012 | Boucher et al. |
| 2012/0280382 A1 | 11/2012 | Im et al. |
| 2012/0285673 A1 | 11/2012 | Cola et al. |
| 2012/0288725 A1 | 11/2012 | Tanaka et al. |
| 2012/0292005 A1 | 11/2012 | Bruzda et al. |
| 2013/0127069 A1 | 5/2013 | Boday et al. |
| 2013/0199724 A1 | 8/2013 | Dershem |
| 2013/0248163 A1 | 9/2013 | Bhagwagar et al. |
| 2013/0265721 A1 | 10/2013 | Strader et al. |
| 2013/0285233 A1 | 10/2013 | Bao et al. |
| 2013/0288462 A1 | 10/2013 | Stender et al. |
| 2013/0299140 A1 | 11/2013 | Ling et al. |
| 2014/0043754 A1 | 2/2014 | Hartmann et al. |
| 2014/0150844 A1* | 6/2014 | Azechi ............ H01B 1/22 136/244 |
| 2014/0190672 A1 | 7/2014 | Swaroop et al. |
| 2014/0264818 A1 | 9/2014 | Lowe, Jr. et al. |
| 2015/0000151 A1 | 1/2015 | Roth et al. |
| 2015/0008361 A1 | 1/2015 | Hattori |
| 2015/0125646 A1 | 5/2015 | Tournilhac et al. |
| 2015/0138739 A1 | 5/2015 | Hishiki |
| 2015/0158982 A1 | 6/2015 | Saito et al. |
| 2015/0183951 A1 | 7/2015 | Bhagwagar et al. |
| 2015/0275060 A1 | 10/2015 | Kuroda et al. |
| 2015/0279762 A1 | 10/2015 | Lowe et al. |
| 2015/0307743 A1 | 10/2015 | Ireland et al. |
| 2016/0009865 A1 | 1/2016 | Jiang et al. |
| 2016/0096984 A1* | 4/2016 | Matsumoto ............ C08L 83/00 252/75 |
| 2016/0160102 A1 | 6/2016 | Minegishi et al. |
| 2016/0160104 A1 | 6/2016 | Bruzda et al. |
| 2016/0226114 A1 | 8/2016 | Hartmann et al. |
| 2016/0272839 A1 | 9/2016 | Yamamoto et al. |
| 2017/0009362 A1 | 1/2017 | Werner et al. |
| 2017/0018481 A1 | 1/2017 | Zeng et al. |
| 2017/0107415 A1 | 4/2017 | Shiono |
| 2017/0137685 A1 | 5/2017 | Liu et al. |
| 2017/0167716 A1 | 6/2017 | Ezaki et al. |
| 2017/0226396 A1 | 8/2017 | Yang et al. |
| 2017/0243849 A1 | 8/2017 | Sasaki et al. |
| 2017/0317257 A1 | 11/2017 | Ezaki et al. |
| 2017/0321100 A1 | 11/2017 | Zhang et al. |
| 2018/0030327 A1 | 2/2018 | Zhang et al. |
| 2018/0030328 A1 | 2/2018 | Zhang et al. |
| 2018/0085977 A1 | 3/2018 | Ezaki |
| 2018/0194982 A1 | 7/2018 | Ezaki et al. |
| 2018/0267315 A1 | 9/2018 | Yonemura |
| 2018/0358283 A1 | 12/2018 | Zhang et al. |
| 2018/0370189 A1 | 12/2018 | Tang et al. |
| 2019/0048245 A1 | 2/2019 | Liu et al. |
| 2019/0078007 A1 | 3/2019 | Zhang et al. |
| 2019/0085225 A1 | 3/2019 | Zhang et al. |
| 2019/0092993 A1 | 3/2019 | Naik et al. |
| 2019/0119544 A1 | 4/2019 | Shen et al. |
| 2019/0122954 A1 | 4/2019 | Bruzda et al. |

FOREIGN PATENT DOCUMENTS

| | | |
|---|---|---|
| CN | 1407141 A | 4/2003 |
| CN | 1456710 A | 11/2003 |

(56) References Cited

FOREIGN PATENT DOCUMENTS

| | | | |
|---|---|---|---|
| CN | 1549875 A | 11/2004 |
| CN | 1580116 A | 2/2005 |
| CN | 1638952 A | 7/2005 |
| CN | 1940007 A | 4/2007 |
| CN | 1970666 A | 5/2007 |
| CN | 1972988 A | 5/2007 |
| CN | 100351075 C | 11/2007 |
| CN | 101067030 A | 11/2007 |
| CN | 101090922 B | 12/2007 |
| CN | 101113241 A | 1/2008 |
| CN | 101126016 A | 2/2008 |
| CN | 100394566 C | 6/2008 |
| CN | 101288353 A | 10/2008 |
| CN | 101445627 A | 6/2009 |
| CN | 101525489 A | 9/2009 |
| CN | 101735619 B | 6/2010 |
| CN | 101835830 B | 9/2010 |
| CN | 101942197 A | 1/2011 |
| CN | 102134474 B | 7/2011 |
| CN | 102341474 B | 2/2012 |
| CN | 102348763 B | 2/2012 |
| CN | 102627943 A | 8/2012 |
| CN | 102634212 A | 8/2012 |
| CN | 103087389 A | 5/2013 |
| CN | 103102552 A | 5/2013 |
| CN | 103102689 A | 5/2013 |
| CN | 103131138 B | 6/2013 |
| CN | 103214848 A | 7/2013 |
| CN | 103254647 A | 8/2013 |
| CN | 103333447 A | 10/2013 |
| CN | 103409116 B | 11/2013 |
| CN | 103436027 B | 12/2013 |
| CN | 103709757 A | 4/2014 |
| CN | 103756631 A | 4/2014 |
| CN | 103773322 A | 5/2014 |
| CN | 103849356 A | 6/2014 |
| CN | 103865271 B | 6/2014 |
| CN | 103923463 B | 7/2014 |
| CN | 104098914 A | 10/2014 |
| CN | 104136569 A | 11/2014 |
| CN | 104140678 B | 11/2014 |
| CN | 104152103 A | 11/2014 |
| CN | 104194733 A | 12/2014 |
| CN | 104449550 A | 3/2015 |
| CN | 104471012 A | 3/2015 |
| CN | 104497574 A | 4/2015 |
| CN | 104513487 A | 4/2015 |
| CN | 104804705 A | 7/2015 |
| CN | 104861661 A | 8/2015 |
| CN | 105111750 A | 12/2015 |
| CN | 105349113 A | 2/2016 |
| CN | 105419339 A | 3/2016 |
| CN | 104479623 B | 5/2016 |
| CN | 105566920 A | 5/2016 |
| CN | 105670555 A | 6/2016 |
| CN | 105838322 A | 8/2016 |
| CN | 105925243 A | 9/2016 |
| CN | 105980512 A | 9/2016 |
| CN | 106221236 A | 12/2016 |
| CN | 106243720 A | 12/2016 |
| CN | 107057370 A | 8/2017 |
| DE | 102007037435 A1 | 2/2009 |
| DE | 102009001722 A1 | 9/2010 |
| EP | 0466188 A1 | 1/1992 |
| EP | 0519138 A2 | 12/1992 |
| EP | 0816423 A1 | 1/1998 |
| EP | 1099734 A1 | 5/2001 |
| EP | 1149519 B1 | 10/2001 |
| EP | 1224669 B1 | 7/2002 |
| EP | 1291913 A2 | 3/2003 |
| EP | 1414063 A2 | 4/2004 |
| EP | 1514956 B1 | 3/2005 |
| EP | 1629059 B1 | 3/2006 |
| EP | 2194165 A1 | 6/2010 |
| FR | 2848215 A1 | 6/2004 |
| GB | 2508320 B | 4/2014 |
| JP | 57027188 B | 6/1982 |
| JP | 0543116 B2 | 5/1986 |
| JP | 06-209057 A | 7/1994 |
| JP | 02611364 B2 | 5/1997 |
| JP | 3662715 B2 | 1/1999 |
| JP | 2000143808 A | 5/2000 |
| JP | 2001139818 A | 5/2001 |
| JP | 2002003830 A | 1/2002 |
| JP | 2003-218296 A | 7/2003 |
| JP | 4016326 B2 | 3/2004 |
| JP | 4288469 B2 | 10/2004 |
| JP | 2005-032468 A | 2/2005 |
| JP | 2006-502248 A | 1/2006 |
| JP | 2007002002 A | 1/2007 |
| JP | 2007-106809 A | 4/2007 |
| JP | 2007-131798 A | 5/2007 |
| JP | 2008063412 A | 3/2008 |
| JP | 5269366 B2 | 3/2009 |
| JP | 2009102577 A | 5/2009 |
| JP | 5137538 B2 | 6/2009 |
| JP | 2009138036 A | 6/2009 |
| JP | 2009-209230 * | 9/2009 |
| JP | 5607298 B2 | 3/2010 |
| JP | 2010-120979 A | 6/2010 |
| JP | 4480457 B2 | 6/2010 |
| JP | 5390202 B2 | 8/2010 |
| JP | 2010-248349 A | 11/2010 |
| JP | 2010248277 A | 11/2010 |
| JP | 2010278115 A | 12/2010 |
| JP | 5463116 B2 | 4/2011 |
| JP | 5318733 B2 | 6/2011 |
| JP | 2011-144234 A | 7/2011 |
| JP | 2011165792 A | 8/2011 |
| JP | 2012-119725 A | 6/2012 |
| JP | 2012-201106 A | 10/2012 |
| JP | 5687167 B2 | 4/2013 |
| JP | 2014105283 A | 6/2014 |
| JP | 5944306 B2 | 7/2014 |
| JP | 5372270 B1 | 9/2014 |
| JP | 2014194006 A | 10/2014 |
| JP | 2015-212318 A | 11/2015 |
| JP | 2016-506992 A | 3/2016 |
| JP | 2016-216523 A | 12/2016 |
| JP | 2019-522711 A | 8/2019 |
| KR | 100479857 B1 | 7/2003 |
| KR | 10-2007-0089169 A | 8/2007 |
| KR | 20070116654 A | 12/2007 |
| KR | 10-0820902 B1 | 4/2008 |
| KR | 0953679 B1 | 4/2010 |
| KR | 1175948 B1 | 8/2012 |
| KR | 10-2015-0049376 A | 5/2015 |
| KR | 10-2016-0130273 A | 11/2016 |
| TW | 569348 B | 1/2004 |
| TW | 200907040 A | 2/2009 |
| TW | 201033268 A | 9/2010 |
| TW | 201527309 A | 7/2015 |
| TW | 201546257 A | 12/2015 |
| WO | 87/06492 A1 | 11/1987 |
| WO | 1997026297 A1 | 7/1997 |
| WO | 0120618 A1 | 3/2001 |
| WO | 01/93648 A2 | 12/2001 |
| WO | 03052818 A1 | 6/2003 |
| WO | 2003064148 A1 | 8/2003 |
| WO | 2004/001844 A2 | 12/2003 |
| WO | 2004008497 A2 | 1/2004 |
| WO | 2004022330 A1 | 3/2004 |
| WO | 2005/011146 A1 | 2/2005 |
| WO | 2005021257 A1 | 3/2005 |
| WO | 2005111146 A1 | 11/2005 |
| WO | 2005119771 A1 | 12/2005 |
| WO | 2006/014171 A1 | 2/2006 |
| WO | 2006023860 A2 | 3/2006 |
| WO | 2007027670 A1 | 3/2007 |
| WO | 2008014171 A2 | 1/2008 |
| WO | 2008103219 A1 | 8/2008 |
| WO | 2008121491 A1 | 10/2008 |
| WO | 2008121970 A1 | 10/2008 |
| WO | 2009032212 A1 | 3/2009 |

(56) References Cited

FOREIGN PATENT DOCUMENTS

| | | |
|---|---|---|
| WO | 2010/104534 A1 | 9/2010 |
| WO | 2010/104542 A1 | 9/2010 |
| WO | 2013/074920 A1 | 5/2013 |
| WO | 2013/129600 A1 | 9/2013 |
| WO | 2013/168291 A1 | 11/2013 |
| WO | 2013191116 A1 | 12/2013 |
| WO | 2014007119 A1 | 1/2014 |
| WO | 2014/021980 A1 | 2/2014 |
| WO | 2014160067 A1 | 10/2014 |
| WO | 2015/120773 A1 | 8/2015 |
| WO | 2015/131370 A1 | 9/2015 |
| WO | 2015179056 A1 | 11/2015 |
| WO | 2016004565 A1 | 1/2016 |
| WO | 2016103424 A1 | 6/2016 |
| WO | 2016/111139 A1 | 7/2016 |
| WO | 2018/022288 A2 | 2/2018 |
| WO | 2018/022293 A2 | 2/2018 |
| WO | 2018068222 A1 | 4/2018 |

OTHER PUBLICATIONS

International Search Report and Written Opinion received for PCT Patent Application No. PCT/US17/41447, dated Oct. 19, 2017, 10 pages.
International Search Report and Written Opinion received for PCT Patent Application No. PCT/US2019/017743, dated May 28, 2019, 10 pages.
Search Report issued in Chinese patent application 201410411725X (with English Translation), report dated Jul. 6, 2016, 4 pages.
Singaporean Written Opinion issued in SG Application No. 11201704238Y, completed Apr. 11, 2019, 5 pages.
"Dynasylan 1146: Oligomeric Diamino-Silane-System" Evonik Industries, pp. 1-3, 2008.
"Hi-Flow 225F-AC Reinforced, Phase Change Thermal Interface Material," The Bergquist Company, 1 page, available at least as early as Aug. 31, 2017.
"Semicosil 9212A." Wacker Silicones Material Safety Data Sheet, pp. 1-8, printed Dec. 11, 2009.
"Semicosil 9212B." Wacker Silicones Material Safety Data Sheet, pp. 1-8, printed Dec. 11, 2009.
"THERM-A-GAP HCS10,569,570,579 and 580 Thermally Conductive Gap Filler Pads," Parker Chomerics, Engineering Your Success, pp. 11-12, available at least as early as the filing date of the present application.
Aranzabe, Estibaliz, et al. "More than Color: Pigments with Thermal Storage Capacity; Processing and Degradation Behavior." Advances in Materials Physics and Chemistry, 5:171-184, 2015.
Dow Corning® Two-Part RTV Silicone Sealant: Total Assembly Solutions for Home Appliance Production; www.dowcorning.com; Form No. 80-3375-01; 6 pages.
Evonik, Silanes for Adhesives and Sealants, 2013, p. 1-24.
Extended European Search Report issued in EP Application 14867847. 7, dated Jun. 26, 2017, 7 pages.
Extended European Search Report issued in EP Application No. 14897036.1, dated Jul. 2, 2018, 7 pages.
Extended Search Report issued in EP Application 14907530.1, dated Jun. 27, 2018, 9 pages.
Fink, Johannes Karl. "Chapter 18: Metal Deactivators." in: A Concise Introduction to Additives for Thermoplastic Polymers, Wiley-Scrivener, pp. 165-171, Jan. 1, 2010.
Gowda, Arun, et al. "Choosing the Right Thermal Interface Material." Solid State Technology, Insights for Electronics Manufacturing, Online Blog, 9 pages, 2005. Retrieved May 25, 2017 from the Internet <http://electroiq.com/blog/2005/03/choosing-the-right-thermal-interface-material/.
International Preliminary Report on Patentability issued in PCT/CN2016/075827, dated Sep. 20, 2018, 5 pages.
International Search Report and Written Opinion issued in PCT/CN2014/081724. dated Apr. 1, 2015, 12 pages.
International Search Report and Written Opinion issued in PCT/CN2014/093138, dated Sep. 6, 2015, 8 pages.
International Search Report and Written Opinion issued in PCT/CN2016/075827, dated Dec. 1, 2016, 7 pages.
International Search Report and Written Opinion issued in PCT/CN2016/101874, dated Apr. 28, 2017, 12 pages.
International Search Report and Written Opinion issued in PCT/US2014/068033, dated Mar. 26, 2015, 12 pages.
International Search Report and Written Opinion issued in PCT/US2017/041498, dated Oct. 20, 2017, 10 pages.
International Search Report and Written Opinion issued in PCT/US2018/049218, dated Dec. 28, 2018, 13 pages.
International Search Report and Written Opinion issued in PCT/US2018/056870, dated Feb. 8, 2019, 9 pages.
Martyak et al., On the oxidation of tin(II) in methanesulfonate solutions and the role of sulfate, Galvanotechnik (2005), 96(3), 594-601 (Abstract).
Ping, Ding, et al. "Preparation and Application Research of Novel Silicone Gel for High-Power IGBT." Insulating Materials, 47(2):52-55, Chinese text with English translation of Abstract, 2014.
Ramaswamy, C., et al. "Phase Change Materials as a Viable Thermal Interface Material for High-Power Electronic Applications." The Ninth Intersociety Conference on Thermal and Thermomechanical Phenomena in Electronic Systems, IEEE, 2:687-691, 2004.
Search Report issued in CN application 201480066502.2, dated May 18, 2017, 2 pages.
Singaporean Search Report and Written Opinion issued in SG Application No. 11201704238Y, completed May 18, 2018, 9 pages.
Singaporean Written Opinion issued in SG Application No. 11201704238Y, completed Feb. 7, 2019, 7 pages.
Wacker Silicones, Catalyst EP/Inhibitor PT 88 product data sheet, p. 1-3, Oct. 6, 2008.
Yasuhiro Aoyagi et al., "Effects of antioxidants and the solild component on the thermal stability of polyol-ester-based thermal pastes", J Mater Sci (2007) 42:2358-2375; Mar. 12, 2007.
Yasuhiro Aoyagi et al., "Polyol-Based Phase-Change Thermal Interface Materials", Journal of Electronic Materials, vol. 35, No. 3, (2006); pp: 416-424.
Yunsheng Xu et al., "Lithium Doped Polyethylene-Glycol-Based Thermal Interface Pastes for High Thermal Contact Conductance", Transactions of the ASME; Journal of Electronic Packagiing, vol. 124, Sep. 2002; pp: 188-191.

* cited by examiner

Comp. Ex.1

Ex.1

Ex.1

GEL-TYPE THERMAL INTERFACE MATERIAL

CROSS-REFERENCE TO RELATED APPLICATION

This application claims priority to U.S. Provisional Patent Application Ser. No. 62/630,928 filed Feb. 15, 2018, which is herein incorporated by reference in its entirety.

FIELD OF THE INVENTION

The present disclosure relates generally to thermal interface materials, and more particularly to gel-type thermal interface materials.

DESCRIPTION OF THE RELATED ART

Thermal interface materials (TIMs) are widely used to dissipate heat from electronic components, such as central processing units, video graphics arrays, servers, game consoles, smart phones, LED boards, and the like. Thermal interface materials are typically used to transfer excess heat from the electronic component to a heat spreader, such as a heat sink.

A typical electronics package structure 10 including thermal interface materials is illustrated in FIG. 1. The electronics package structure 10 illustratively includes a heat generating component, such as an electronic chip 12, and one or more heat dissipating components, such as a heat spreader 14, and a heat sink 16. Illustrative heat spreaders 14 and heat sinks comprise a metal, metal alloy, or metal-plated substrate, such as copper, copper alloy, aluminum, aluminum alloy, or nickel-plated copper. TIM materials, such as TIM 18 and TIM 20, provide a thermal connection between the heat generating component and the one or more heat dissipating components. Electronics package structure 10 includes a first TIM 18 connecting the electronic chip 12 and heat spreader 14. TIM 18 is typically referred to as a "TIM 1". Electronics package structure 10 includes a second TIM 20 connecting the heat spreader 14 and heat sink 16. TIM 20 is typically referred to as a "TIM 2". In another embodiment, electronics package structure 10 does not include a heat spreader 14, and a TIM (not shown) connects the electronic chip 12 directly to the heat sink 16. Such a TIM connecting the electronic chip 12 directly to the heat sink 16 is typically referred to as a TIM 1.5.

Traditional thermal interface materials include components such as gap pads. However, gap pads have certain disadvantages, such as inability to meet very small thickness requirements and being difficult to use in automated production.

Other thermal interface materials include gel products. Gel products may be automatically dispensed for large scale production, and can be formed to desired shapes and thicknesses. However, typical gel products with good flow properties may potentially experience oil leaking (also known as "bleeding"). Improvements in the foregoing are desired.

SUMMARY OF THE INVENTION

The present disclosure provides thermal interface materials that are useful in transferring heat from heat generating electronic devices, such as computer chips, to heat dissipating structures, such as heat spreaders and heat sinks. The thermal interface material includes at least one silicone oil, at least one catalyst, at least one thermally conductive filler having a relatively large surface area, a solvent, at least one inhibitor, and at least one crosslinker. The at least one thermally conductive filler reduces the oil leakage of the TIM, and the solvent increases the flow rate of the TIM without negating the reduction of oil leakage realized by the thermally conductive fillers.

In one exemplary embodiment, a thermal interface material is provided. The thermal interface material includes a low molecular weight silicone oil having a weight ($M_w$) average molecular weight less than 50,000 Daltons; at least one thermally conductive filler having a surface area greater than 1.0 $m^2/g$; and a high molecular weight silicone oil, wherein the high molecular weight silicone oil comprises a vinyl functional silicone oil having a weight ($M_w$) average molecular weight of at least 60,000 Daltons.

In one more particular embodiment, the thermal interface material has a viscosity greater than 1500 Pa.s. In one more particular embodiment, the thermal interface material further includes a solvent having a boiling point between 60° C. and 220° C. and a viscosity between 0.2 cSt and 50 cSt. In one more particular embodiment, the thermal interface material has a viscosity between 150 Pa.s and 650 Pa.s. In one more particular embodiment, the at least one thermally conductive filler includes a first thermally conductive filler, a second thermally conductive filler, and a third thermally conductive filler, wherein the first thermally conductive filer is a metal oxide having a surface area between 0.1 $m^2/g$ to 1.0 $m^2/g$, the second thermally conductive filler is a metal oxide having a surface area between 0.5 $m^2/g$ and 2.0 $m^2/g$, and the third thermally conductive filler is a metal oxide having a surface area between 5.0 $m^2/g$ and 10.0 $m^2/g$. In one more particular embodiment, the first thermally conductive filler has an average particle size of at least 10 microns, the second thermally conductive filler has an average particle size between 1 micron and 10 microns, and the third thermally conductive filler has an average particle size less than 1 micron.

In one more particular embodiment, the thermal interface material comprises: from 2 wt. % to 10 wt. % of the low molecular weight silicone oil; from 50 wt. % to 95 wt. % of the at least one thermally conductive filler; and from 0.1 wt. % to 5 wt. % of the high molecular weight silicone oil; from 0.1 wt. % to 5 wt. % of a solvent; from 0.1 wt. % to 5 wt. % of a coupling agent; from 0.1 wt. % to 1 wt. % of a crosslinker; from 0.1 wt. % to 5 wt. % of an inhibitor; and from 0.1 wt. % to 5 wt. % of a catalyst. In one more particular embodiment, the at least one thermally conductive filler includes: from 25 wt. % to 50 wt. % of a first thermally conductive filler having a surface area between 0.1 $m^2/g$ to 1.0 $m^2/g$; from 25 wt. % to 50 wt. % of a second thermally conductive filler having a surface area between 0.5 $m^2/g$ and 2.0 $m^2/g$; and from 25 wt. % to 50 wt. % of a third thermally conductive filler having a surface area between 5.0 $m^2/g$ and 10.0 $m^2/g$. In one more particular embodiment, the thermal interface material has a viscosity between 150 Pa.s and 650 Pa.s.

In one embodiment, a thermal interface material is provided. The thermal interface material includes: a low molecular weight silicone oil having a weight ($M_w$) average molecular weight less than 50,000 Daltons; a first thermally conductive filler, a second thermally conductive filler, and a third thermally conductive filler, wherein the first thermally conductive filer is a metal oxide having a surface area between 0.1 $m^2/g$ to 1.0 $m^2/g$, the second thermally conductive filler is a metal oxide having a surface area between 0.5 $m^2/g$ and 2.0 $m^2/g$, and the third thermally conductive filler is a metal oxide having a surface area between 5.0 $m^2/g$ and 10.0 m²/g; and a high molecular weight silicone oil, wherein the high molecular weight silicone oil comprises a vinyl functional silicone oil having a weight ($M_w$) average molecular weight of at least 60,000 Daltons; and a solvent having a boiling point between 60° C. and 220° C. and a viscosity between 0.2 cSt and 50 cSt.

In one more particular embodiment, the thermal interface material comprises: from 2 wt. % to 10 wt. % of the low molecular weight silicone oil; from 25 wt. % to 50 wt. % of a first thermally conductive filler having a surface area between 0.1 m²/g to 1.0 m²/g; from 25 wt. % to 50 wt. % of a second thermally conductive filler having a surface area between 0.5 m²/g and 2.0 m²/g; and from 25 wt. % to 50 wt. % of a third thermally conductive filler having a surface area between 5.0 m²/g and 10.0 m²/g; from 0.1 wt. % to 5 wt. % of the high molecular weight silicone oil; from 0.1 wt. % to 5 wt. % of a solvent; from 0.1 wt. % to 5 wt. % of a coupling agent; from 0.1 wt. % to 1 wt. % of a crosslinker; from 0.1 wt. % to 5 wt. % of an inhibitor; and from 0.1 wt. % to 5 wt. % of a catalyst. In one more particular embodiment, the low molecular weight silicone oil comprises a vinyl functional silicone oil and the high molecular weight silicone oil is a vinyl silicone oil having a kinematic viscosity of 2,000,000 cSt. In one more particular embodiment, the first thermally conductive filler has an average particle size of at least 10 microns, the second thermally conductive filler has an average particle size between 1 micron and 10 microns, and the third thermally conductive filler has an average particle size less than 1 micron. In one more particular embodiment, the thermal interface material has a bleeding trace value of between 1 mm and 5 mm and a flowrate between 20 g/min and 50 g/min. In one more particular embodiment, the thermal interface material has a viscosity between 150 Pa.s and 650 Pa.s.

In one embodiment, an electronic component is provided. The electronic component includes: a heat sink; an electronic chip; a thermal interface material positioned between the heat sink and electronic chip, the thermal interface material including: a low molecular weight silicone oil having a weight ($M_w$) average molecular weight less than 50,000 Daltons; at least one thermally conductive filler having a surface area greater than 1.0 m²/g; and a high molecular weight silicone oil, wherein the high molecular weight silicone oil comprises a vinyl functional silicone oil having a weight ($M_w$) average molecular weight of at least 60,000 Daltons.

In one more particular embodiment, the thermal interface material has a viscosity greater than 1500 Pa.s. In one more particular embodiment, the electronic component further includes: a solvent having a boiling point between 60° C. and 220° C. and a viscosity between 0.2 cSt and 50 cSt. In one more particular embodiment, the thermal interface material has a viscosity between 150 Pa·s and 650 Pa·s. In one more particular embodiment, the at least one thermally conductive filler includes a first thermally conductive filler, a second thermally conductive filler, and a third thermally conductive filler, wherein the first thermally conductive filler is a metal oxide having a surface area between 0.1 m²/g to 1.0 m²/g, the second thermally conductive filler is a metal oxide having a surface area between 0.5 m²/g and 2.0 m²/g, and the third thermally conductive filler is a metal oxide having a surface area between 5.0 m²/g and 10.0 m²/g.

In one more particular embodiment, the electronic component further comprises a heat spreader positioned between the heat sink and the electronic chip, wherein the first surface layer is in contact with a surface of the electronic chip and the second surface layer is in contact with the heat spreader. In one more particular embodiment, the electronic component further comprises a heat spreader positioned between the heat sink and the electronic chip, wherein the first surface layer is in contact with a surface of the heat spreader and the second surface layer is in contact with the heat sink.

BRIEF DESCRIPTION OF THE DRAWINGS

The above-mentioned and other features and advantages of this disclosure, and the manner of attaining them, will become more apparent and the invention itself will be better understood by reference to the following description of embodiments of the invention taken in conjunction with the accompanying drawings, wherein.

Corresponding reference characters indicate corresponding parts throughout the several views. The exemplifications set out herein illustrate exemplary embodiments of the invention and such exemplifications are not to be construed as limiting the scope of the invention in any manner.

DETAILED DESCRIPTION

A. Thermal Interface Material

Figure 1:
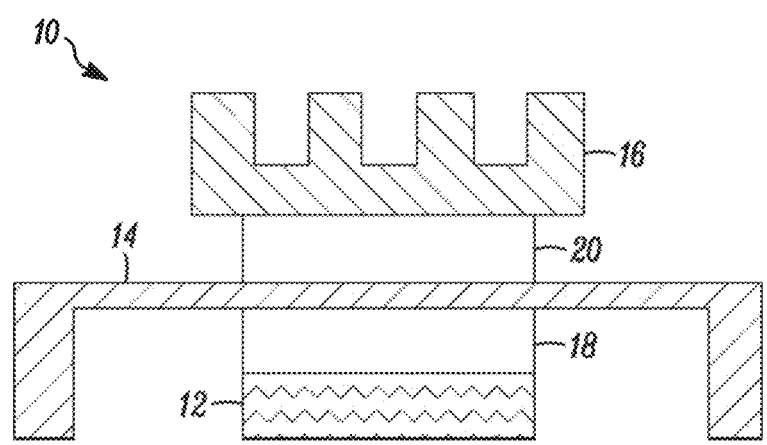
FIG. 1 schematically illustrates a typical electronics package structure.

The present invention relates to thermal interface materials (TIMs) useful in transferring heat away from electronic components. In one exemplary embodiment, the TIM comprises at least one silicone oil, at least one catalyst, at least one thermally conductive filler having a relatively larger surface area, a solvent, at least one inhibitor, and at least one crosslinker. The at least one thermally conductive filler reduces the oil leakage of the TIM, and the solvent increases the flow rate of the TIM without negating the reduction of oil leakage realized by the thermally conductive fillers.

1. Silicone Oil a. General Description

The present disclosure provides a matrix for a TIM material that includes at least one low molecular weight silicone oil and at least one high molecular weight silicone oil. The silicone oil includes one or more crosslinkable groups, such as vinyl, hydride, hydroxyl and acrylate functional groups, that are crosslinked by a catalyst. In one embodiment, one or more silicone oils include a first silicone oil and a second silicone oil, where the first silicone oil is a vinyl functional silicone oil and the second silicone oil is a hydride functional silicone oil. The silicone oil wets the thermally conductive filler and forms a dispensable fluid for the TIM.

In one exemplary embodiment, the silicone oil includes a silicone rubber such as the KE series products available from Shin-Etsu, such as SILBIONE® available from Bluestar, such as ELASTOSIL®, SilGel®, SILPURAN®, and SEMICOSIL® available from Wacker, such as Silopren® available from Momentive, such as Dow Corning®, Silastic®, XIAMETER®, Syl-off® and SYLGARD® available from Dow Corning, such as SQUARE® available from Square Silicone, such as Andril® available from AB specialty Silicones. Other polysiloxanes are available from Wacker, Shin-etsu, Dowcoring, Momentive, Bluestar, RUNHE, AB Specialty Silicones, Gelest, and United Chemical Technologies.

b. Low Molecular Weight Silicone Oil

1. Vinyl Functional Silicone Oil

The TIM includes a low weight average molecular weight silicone oil as measured by gel permeation chromatography (GPC). The low molecular weight silicone oil wets the thermally conductive filler to form a dispensable fluid for the TIM. Exemplary low molecular weight silicone oils may include a vinyl silicone oil having a general formula as shown below:

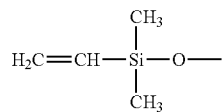

An exemplary low molecular weight vinyl silicone oil may also include a small amount of platinum catalyst.

Vinyl functional silicone oils include an organo-silicone component with Si—CH=CH$_2$ groups. Exemplary vinyl functional silicone oils include vinyl-terminated silicone oils and vinyl-grafted silicone oils in which the Si—CH=CH$_2$ group is grafted onto the polymer chain, and combinations thereof.

Exemplary vinyl-terminated silicone oils include vinyl terminated polydimethylsiloxane, such as DMS-V00 (having a weight average molecular weight ($M_w$) of 186 Daltons), DMS-V03 (having a $M_w$ of about 500 Daltons), DMS-V05 (having a $M_w$ of about 800 Daltons), DMS-V21 (having a $M_w$ of about 6,000 Daltons), DMS-V22 (having a $M_w$ of about 9400 Daltons), DMS-V25 (having a $M_w$ of about 17,200 Daltons), DMS-V25R (having a $M_w$ of about 17,200 Daltons), DMS-V35 (having a $M_w$ of about 49,500 Daltons), DMS-V35R (having a $M_w$ of about 49,500 Daltons), each available from Gelest, Inc. Exemplary vinyl-terminated silicone oils include vinyl terminated diphenylsiloxane-dimethylsiloxane copolymer, such as PDV-0325 (having a $M_w$ of about 15,500 Daltons), PDV-0331 (having a $M_w$ of about 27,000 Daltons), PDV-0525 (having a $M_w$ of about 14,000 Daltons), PDV-1625 (having a $M_w$ of about 9,500 Daltons), PDV-1631 (having a $M_w$ of about 19,000 Daltons), PDV-2331 (having a $M_w$ of about 12,500 Daltons), each available from Gelest, Inc. Exemplary vinyl-terminated silicone oils include vinyl terminated polyphenylmethylsiloxane, such as PMV-9925 (having a $M_w$ of about 2000-3000 Daltons) available from Gelest, Inc. Exemplary vinyl-terminated silicone oils include vinyl terminated diethylsiloxane-dimethylsiloxane copolymer, such as EDV-2025(having a $M_w$ of about 16,500-19,000 Daltons) available from Gelest, Inc.

Exemplary vinyl-grafted silicone oils include vinylmethylsiloxane homopolymers, such as VMS-005 (having a $M_w$ of about 258-431 Daltons), VMS-T11 (having a $M_w$ of about 1000-1500 Daltons), both available from Gelest, Inc. Exemplary vinyl-grafted silicone oils include vinylmethylsiloxane-dimethylsiloxane copolymers, such as trimethylsiloxyl terminated silicone oils, silanol terminated silicone oils, and vinyl terminated silicone oils.

In one exemplary embodiment, the vinyl-grafted silicone oil is a vinylmethylsiloxane terpolymers, including a vinylmethylsiloxane-octylmethylsiloxane-dimethylsiloxane terpolymer, such as VAT-4326(having a $M_w$ of about 10,000-12,000 Daltons), or a vinylmethylsiloxane-methoxypolyethylenoxypropylmethylsiloxane-dimethylsiloxan e terpolymer, such as VBT-1323(having a $M_w$ of about 8,000-12,000 Daltons), or a vinylmethylsiloxane-phenylmethylsiloxane-dimethylsiloxane(having a $M_w$ of about 2,500-3,000 Daltons); each available from Gelest, Inc.

In one exemplary embodiment, the vinyl-functional silicone oil comprises a vinyl T resin or a vinyl Q resin.

In one exemplary embodiment, the silicone oil is a vinyl functional oil, such as RH-Vi303, RH-Vi301 from RUNHE, such as Andril® VS 200, Andril® VS 1000 from AB Specialty Silicones.

Exemplary low molecular weight silicone oils may have a weight ($M_w$) average molecular weight as little as 50 Daltons, 500 Daltons, 1000 Daltons, as great as 5000 Daltons, 10,000 Daltons, 50,000 Daltons, or within any range defined between any two of the foregoing values such as between 50 Daltons to 50,000 Daltons, 500 Daltons to 50,000 Daltons, or 1,000 Daltons to 50,000 Daltons, for example.

Exemplary low molecular weight silicone oils may have a kinematic viscosity as little as 0.5 cSt, 5 cSt, 100 cSt, as great as 5,000 cSt, 10,000 cSt, 50,000 cSt, or within any range defined between any two of the foregoing values, such as 0.5 cSt to 50,000 cSt, 5 cSt to 10,000 cSt, or 100 cSt to 5,000 cSt, for example, as measured according to ASTM D445. In one exemplary embodiment, an exemplary low molecular weight silicone oil is a low molecular weight vinyl silicone oil having a kinematic viscosity of 1,000 cSt. In another exemplary embodiment, an exemplary low molecular weight silicone oil is a low molecular weight vinyl silicone oil having a kinematic viscosity above 1,500 cSt.

The TIM comprises one or more low molecular weight silicone oils in an amount as little as 0.1 wt. %, 0.5 wt. %, 0.67 wt. %, 1 wt. %, as great as 3 wt. %, 5 wt. %, 10 wt. %, 20 wt. %, or within any range defined between any two of the foregoing values, based on the total weight of the TIM, such as 0.1 wt. % to 15 wt. %, 0.1 wt. % to 10 wt. %, or 0.67 wt. % to 10 wt. %.

c. High Molecular Weight Silicone Oil

The TIM includes a high molecular weight silicone oil as measured by gel permeation chromatography (GPC). The high molecular weight silicone oil functions to prevent cracking of the TIM during thermal cycling. Exemplary high molecular weight silicone oils may include a vinyl silicone oil having a general formula as shown below, similar to the low molecular weight silicone oils described above:

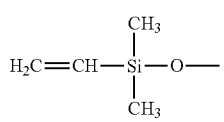

Vinyl functional silicone oils include an organo-silicone component with Si—CH=CH$_2$ groups. Exemplary vinyl functional silicone oils include vinyl-terminated silicone oils and vinyl-grafted silicone oils in which the Si—CH=CH$_2$ group is grafted onto the polymer chain, and combinations thereof.

Exemplary vinyl-terminated silicone oils include vinyl terminated polydimethylsiloxane, such as DMS-V41 (having a M$_w$ of about 62,700 Daltons), DMS-V42 (having a M$_w$ of about 72,000 Daltons), DMS-V46 (having a M$_w$ of about 117,000 Daltons), DMS-V51 (having a M$_w$ of about 140,000 Daltons), and DMS-V52 (having a M$_w$ of about 155,000 Daltons), each available from Gelest, Inc.

Exemplary vinyl-grafted silicone oils include vinylmethylsiloxane-dimethylsiloxane copolymers, such as trimethylsiloxyl terminated silicone oils, silanol terminated silicone oils, and vinyl terminated silicone oils.

In one exemplary embodiment, the vinyl-grafted silicone oil is a vinylmethylsiloxane terpolymers. In one exemplary embodiment, the vinyl-functional silicone oil comprises a vinyl T resin or a vinyl Q resin.

Another exemplary high molecular weight silicone oil may include a hydride functional silicone oil having an organo-silicone component and Si—H groups. Exemplary hydride functional silicone oils include hydride-terminated silicone oils, hydride-grafted silicone oils in which the Si—H group is grafted onto the polymer chain, and combinations thereof.

In one exemplary embodiment, the hydride-terminated silicone oil is a hydride terminated polydimethylsiloxane such as DMS-H41(having a M$_w$ of about 62,700 Daltons), available from Gelest, Inc. In one exemplary embodiment, the hydride-terminated silicone oil is a methylhydrosiloxane-dimethylsiloxane copolymer, such as a trimethylsiloxyl terminated or hydride terminated. Exemplary trimethylsiloxyl terminated copolymers include HMS-064 (having a M$_w$ of about 60,000-65,000 Daltons), available from Gelest, Inc.

Exemplary low molecular weight silicone oils may have a weight (M$_w$) average molecular weight as little as 100,000 Daltons, 300,000 Daltons, 500,000 Daltons, as great as 1,000,000 Daltons, 10,000,000 Daltons, 100,000,000 Daltons, or within any range defined between any two of the foregoing values, such as 100,000 Daltons to 100,000,000 Daltons, 300,000 Daltons to 10,000,000 Daltons, or 500,000 Daltons to 1,000,000 Daltons, for example.

Exemplary high molecular weight silicone oils may have a kinematic viscosity as little as 10,000 cSt, 20,000 cSt, 100,000 cSt, as great as 1,000,000 cSt, 10,000,000 cSt, 100,000,000 cSt, or within any range defined between any two of the foregoing values, such as 10,000 cSt to 100,000,000 cSt, 20,000 cSt to 10,000,000 cSt, or 100,000 cSt to 1,000,000 cSt, for example, as measured according to ASTM D445. In one exemplary embodiment, an exemplary high molecular weight silicone oil is a high molecular weight vinyl silicone oil having a kinematic viscosity of 2,000,000 cSt.

The TIM may comprise one or more high molecular weight silicone oils in an amount as little as 0.01 wt %, 0.1 wt. %, 0.25 wt. %, 0.5 wt. %, 0.67 wt. %, 0.75 wt. %, as great as 1 wt. %, 1.5 wt. %, 2 wt. %, 5 wt. %, or within any range defined between any two of the foregoing values, based on the total weight of the TIM, such as 0.1 wt. % to 5 wt. %, 0.1 wt. % to 1 wt. %, or 0.25 wt. % to 0.67 wt. %. In one exemplary embodiment, the TIM includes a high molecular weight silicone oil in the amount of about 1.5 wt. %.

2. Catalyst

The TIM further includes one or more catalyst for catalyzing the addition reaction. Exemplary catalysts comprise platinum containing materials and rhodium containing materials. Exemplary platinum containing catalysts may have the general formula shown below:

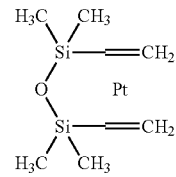

Exemplary platinum contain catalysts include: Platinum cyclovinylmethylsiloxane complex(Ashby Karstedt Catalyst), Platinum carbonyl cyclovinylmethylsiloxane complex (Ossko catalyst), Platinum divinyltetramethyldisiloxane dimethyl fumarate complex, Platinum divinyltetramethyldisiloxane dimethyl maleate complex and the like. Exemplary of Platinum carbonyl cyclovinylmethylsiloxane complexes include SIP6829.2, exemplary of Platinum divinyltetramethyldisiloxane complex include SIP6830.3 and SIP6831.2, exemplary of platinum cyclovinylmethylsiloxane complex include SIP6833.2, all available from Gelest, Inc. Further exemplary platinum containing material catalysts include Catalyst OL available from Wacker Chemie AG, and PC065, PC072, PC073, PC074, PC075, PC076, PC085, PC086, PC087, PC088 available from United Chemical Technologies Inc.

Exemplary rhodium containing materials include Tris(dibutylsulfide)Rhodium trichloride with product code INRH078, available from Gelest, Inc.

Without wishing to be held to any particular theory it is believed that the platinum catalyst reacts with a vinyl silicone oil and a hydrosilicone oil as shown below.

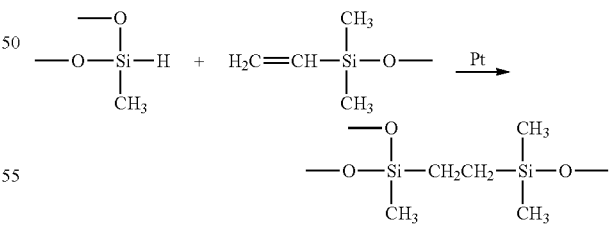

The TIM may comprise the one or more catalyst in an amount as little as 5 ppm, 10 ppm, 15 ppm, 20 ppm, as great as 25 ppm, 30 ppm, 40 ppm, 50 ppm, 100 ppm, 200 ppm, 500 ppm, 1000 ppm, or within any range defined between any two of the foregoing values, based on the total weight of the silicone oil, such as 10 ppm to 30 ppm, 20 ppm to 100 ppm, or 5 ppm to 500 ppm, for example.

In one exemplary embodiment, the catalyst is provided as a mixture with one or more of the silicone oils. In one exemplary embodiment, the platinum containing material catalyst is combined to a functional silicone oil, such as KE-1012-A, KE-1031-A, KE-109E-A, KE-1051J-A, KE-1800T-A, KE1204A, KE1218A available from Shin-Etsu, such as SILBIONE® RT Gel 4725 SLD A available from Bluestar, such as SilGel® 612 A, ELASTOSIL® LR 3153A, ELASTOSIL® LR 3003A, ELASTOSIL® LR 3005A, SEMICOSIL® 961A, SEMICOSIL® 927A, SEMICOSIL® 205A, SILPURAN® 2440 available from Wacker, such as Silopren® LSR 2010A available from Momentive, such as XIAMETER® RBL-9200 A, XIAMETER® RBL-2004 A, XIAMETER® RBL-9050 A, XIAMETER® RBL-1552 A, Silastic® FL 30-9201 A, Silastic® 9202 A, Silastic® 9204 A, Silastic® 9206 A, SYLGARD® 184A, Dow Corning® QP-1 A, Dow corning® C6 A, Dow Corning® CV9204 A available from Dow Corning.

The TIM may comprise a catalyst in an amount as little as 0.01 wt %, 0.1 wt. %, 0.2 wt. %, as great as 0.3 wt. %, 0.4 wt. %, 0.5 wt. %, or within any range defined between any two of the foregoing values, based on the total weight of the TIM, such as 0.01 wt. % to 0.5 wt. %, 0.01 wt. % to 0.4 wt. %, or 0.01 wt. % to 0.3 wt. %, for example. In one exemplary embodiment, the TIM includes a catalyst in the amount of about 0.01 wt. %. In another exemplary embodiment, the TIM includes a catalyst in the amount of about 0.3 wt. %.

In another embodiment, the platinum containing material catalyst is combined to a high molecular weight vinyl functional silicone oil.

3. Thermally Conductive Filler

The TIM includes one or more thermally conductive fillers. The thermally conductive filler provides a thermally conductive material to conduct heat through the thermal interface material. Exemplary thermally conductive fillers include metals, alloys, nonmetals, metal oxides and ceramics, and combinations thereof. The metals include, but are not limited to, aluminum, copper, silver, zinc, nickel, tin, indium, and lead. The nonmetal include, but are not limited to, carbon, graphite, carbon nanotubes, carbon fibers, graphenes, boron nitride and silicon nitride. The metal oxide or ceramics include but not limited to alumina (aluminum oxide), aluminum nitride, boron nitride, zinc oxide, and tin oxide.

The TIM may comprise the one or more thermally conductive fillers in an amount as little as 10 wt. %, 20 wt. %, 25 wt. %, 50 wt. %, as great as 75 wt. %, 80 wt. %, 85 wt %, 90 wt. %, 95 wt. %, 97 wt. %, or within any range defined between any two of the foregoing values, based on the total weight of the TIM, such as 10 wt. % to 95 wt. %, 20 wt. % to 95 wt. %, or 25 wt. % to 90 wt. %, for example.

Exemplary thermally conductive fillers may have an average particle size of as little as 0.1 microns, 1 micron, 10 microns, as great as 50 microns, 75 microns, 100 microns or within any range defined between any two of the foregoing values, such as 0.1 microns to 100 microns, 0.1 microns to 75 microns, or 0.1 microns to 50 microns, for example.

Exemplary thermally conductive fillers may have a surface area as little as $0.10$ m$^2$/g, $0.50$ m$^2$/g, $1.0$ m$^2$/g, as great as $5.0$ m$^2$/g, $7.0$ m$^2$/g, $8.5$ m$^2$/g, $10.0$ m$^2$/g, or within any range defined between any two of the foregoing values, such as $0.1$ m$^2$/g to $0.5$ m$^2$/g, $0.10$ m$^2$/g to $10.0$ m$^2$/g, or $0.10$ m$^2$/g to $8.5$ m$^2$/g as measured by Brunauer-Emmett-Teller (BET) Procedure, ASTM C1274-2012, or ASTM B922-2010. In one exemplary embodiment, an exemplary thermally conductive filler has a surface area of $0.15$ m$^2$/g. In another embodiment, an exemplary thermally conductive filler has a surface area of $1.1$ m$^2$/g. In yet another exemplary embodiment, an exemplary thermally conductive filler has a surface area of $7.6$ m$^2$/g.

Without wishing to be held to a particular theory, it is believed that the higher surface area thermally conductive fillers used in the TIM controls the oil bleeding of the TIM because such high surface area filler(s) reduce the flow rate of the thermal gel (i.e., more viscous). Moreover, a larger surface area filler can absorb oil molecules and because of the intermolecular forces involved with absorption, oil is unable to freely flow from the TIM, thereby reducing oil bleeding. Furthermore, the use of smaller fillers results in short distances between the fillers and forms a capillary network within the TIM. The capillary network absorbs the oil and therefore, reduces the oil bleeding.

In one exemplary embodiment, the TIM may include a first thermally conductive filler, a second thermally conductive filler, and a third thermally conductive filler, wherein the first thermally conductive filer has a surface area as little as $0.1$ m$^2$/g, $0.2$ m$^2$/g, $0.5$ m$^2$/g, as great as $0.6$ m$^2$/g, $0.8$ m$^2$/g, $1.0$ m$^2$/g, or within any range defined therebetween, the second thermally conductive filler has a surface area as little as $0.5$ m$^2$/g, $0.7$ m$^2$/g, $0.9$ m$^2$/g as great as $1.5$ m$^2$/g, $1.7$ m$^2$/g, $2.0$ m$^2$/g, or within any range defined therebetween, and the third thermally conductive filler has a surface area as little as $5.0$ m$^2$/g, $6.0$ m$^2$/g, $7.0$ m$^2$/g, as great as $8.0$ m$^2$/g, $9.0$ m$^2$/g, $10.0$ m$^2$/g or within any range therebetween.

In one exemplary embodiment, the TIM includes a first thermally conductive filler in the amount of as little as 20 wt. %, 25 wt. %, 30 wt. %, as great as 45 wt. %, 50 wt. %, 60 wt % or within any range defined between any two of the foregoing values with respect to the total TIM composition, such as 20 wt. % to 60 wt. %, 25 wt. % to 50 wt. %, or 30 wt. % to 45 wt. %, for example. The first thermally conductive filler has an average particle size of as little as 10 microns. 35 microns, 40 microns, as great as 45 microns, 50 microns, 60 microns, or within any range defined between any two of the foregoing values, such as 10 microns to 60 microns, 10 microns to 50 microns, or 10 microns to 45 microns, for example. The first thermally conductive filler has a surface area as little as $0.1$ m$^2$/g, $0.2$ m$^2$/g, $0.5$ m$^2$/g, as great as $0.6$ m$^2$/g, $0.8$ m$^2$/g, $1.0$ m$^2$/g, or within any range defined therebetween, such as $0.1$ m$^2$/g to $1.0$ m$^2$/g, $0.1$ m$^2$/g to $0.8$ m$^2$/g, or $0.1$ m$^2$/g to $0.6$ m$^2$/g for example.

The exemplary TIM can further include a second thermally conductive filler in the amount of as little as 20 wt. %, 25 wt. %, 30 wt. %, as great as 45 wt. %, 50 wt. %, 60 wt % or within any range defined between any two of the foregoing values with respect to the total TIM composition, such as 20 wt. % to 60 wt. %, 25 wt. % to 50 wt. %, or 25 wt. % to 45 wt. %, for example. The second thermally conductive filler has an average particle size of as little as 1 micron, 3, microns. 5 microns, as great as 10 microns, 15 microns, 20 microns, or within any range defined between any two of the foregoing values, such as 1 micron to 20 microns, 3 microns to 15 microns, or 5 microns to 15 microns, for example. The second thermally conductive filler has a surface area as little as $0.5$ m$^2$/g, $0.7$ m$^2$/g, $0.9$ m$^2$/g as great as $1.5$ m$^2$/g, $1.7$ m$^2$/g, $2.0$ m$^2$/g, or within any range defined therebetween, such as $0.5$ m$^2$/g to $2.0$ m$^2$/g, $0.7$ m$^2$/g to $1.7$ m$^2$/g, or $0.9$ m$^2$/g to $1.5$ m$^2$/g, for example.

The exemplary TIM further includes a third thermally conductive filler in the amount of as little as 20 wt. %, 25 wt. %, 30 wt. %, as great as 45 wt. %, 50 wt. %, 60 wt % or within any range defined between any two of the foregoing values with respect to the total TIM composition, such as 20 wt. % to 60 wt. %, 25 wt. % to 50 wt. %, or 30 wt. % to 45 wt. %, for example. The third thermally conductive filler has an average particle size of as little as 0.1 microns, 0.3, microns. 0.5 microns, as great as 1 micron, 1.5 microns, 2 microns, or within any range defined between any two of the foregoing values, such as 0.1 microns to 2 microns, 0.3 microns to 1.5 microns, or 0.5 microns to 1 micron, for example. The third thermally conductive filler has a surface area as little as 5.0 m$^2$/g, 6.0 m$^2$/g, 7.0 m$^2$/g, as great as 8.0 m$^2$/g, 9.0 m$^2$/g, 10.0 m$^2$/g or within any range therebetween, such as 5.0 m$^2$/g to 10 m$^2$/g, 6.0 m$^2$/g to 9.0 m$^2$/g, or 7.0 m$^2$/g to 8.0 m$^2$/g, for example.

Exemplary TIMs may include a single thermally conductive filler wherein the single thermally conductive filler is one of the first, second, or third thermally conductive fillers as described herein. In another exemplary TIM, the TIM includes a first and a second thermally conductive filler wherein the first thermally conductive filler and the second thermally conductive filler are the first thermally conduct filler and the second thermally conduct filler, the first thermally conduct filler and the third thermally conduct filler, or the second thermally conduct filler and the third thermally conduct filler as described herein. In a further exemplary TIM, the TIM includes the first thermally conduct filler, the second thermally conduct filler, and the third thermally conduct filler as described herein.

Exemplary thermal conductive fillers include alumina oxide.

4. Addition Inhibitor

The TIM comprises one or more addition inhibitors for inhibiting or limiting crosslinking of the silicone oils. The addition inhibitor forms a complex with the catalyst to stop the reaction of the silicone oils. The addition inhibitors includes at least one alkynyl compound, and optionally, the addition inhibitor further includes a multi-vinyl functional polysiloxane.

Exemplary addition inhibitors include acetylenic alcohols such as 1-ethynyl-1-cyclohexanol, 2-methyl-3-butyn-2-ol, 2-phenyl-3-butyn-2-ol, 2-ethynyl-isopropanol, 2-ethynyl-butane-2-ol, and 3,5-dimethyl-1-hexyn-3-ol; silylated acetylenic alcohols such as trimethyl (3,5-dimethyl-1-hexyn-3-oxy)silane, dimethyl-bis-(3-methyl-1-butyn-oxy)silane, methylvinylbis(3-methyl-1-butyn-3-oxy)silane, and ((1,1-dimethyl-2-propynyl)oxy)trimethylsilane; unsaturated carboxylic esters such as diallyl maleate, dimethyl maleate, diethyl fumarate, diallyl fumarate, and bis-2-methoxy-1-methylethylmaleate, mono-octylmaleate, mono-isooctylmaleate, mono-allyl maleate, mono-methyl maleate, mono-ethyl fumarate, mono-allyl fumarate, 2-methoxy-1-methylethylmaleate; fumarate/alcohol mixtures, such as mixtures where the alcohol is selected from benzyl alcohol or 1-octanol and ethenyl cyclohexyl-1-ol; conjugated ene-ynes such as 2-isobutyl-1-butene-3-yne, 3,5-dimethyl-3-hexene-1-yne, 3-methyl-3-pentene-1-yne, 3-methyl-3-hexene-1-yne, 1-ethynylcyclohexene, 3-ethyl-3-butene-1-yne, and 3-phenyl-3-butene-1-yne; vinylcyclosiloxanes such as 1,3,5,7-tetramethyl-1,3,5,7-tetravinylcyclotetrasiloxane, and mixtures of conjugated ene-yne and vinylcyclosiloxane. In one exemplary embodiment, the addition inhibitor is selected from 2-methyl-3-butyn-2-ol or 3-methyl-1-pentyn-3-ol.

In some exemplary embodiments, the addition inhibitor further includes a multi-vinyl functional polysiloxane. An exemplary multi-vinyl functional polysiloxane is a vinyl terminated polydimethylsiloxane in ethynyl cyclohexanol, such as Pt Inhibitor 88 available from Wacker Chemie AG.

Without wishing to be held to any particular theory it is believed that the platinum catalyst forms a complex with ethynyl cyclohexanol and vinyl terminated polydimethylsiloxane as shown below.

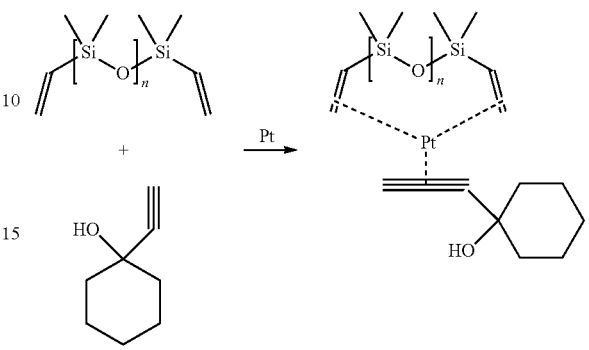

The formation of the complex is believed to decrease the catalyst activity in room temperature, and thus maintaining the dispensability and wettability of the TIM. At the higher temperatures of the curing step, the Pt is released from the complex and help the hydrosilylation of vinyl functional silicone oil and hydride functional silicone oil, provides greater control over the "crosslinking".

In some exemplary embodiments, the TIM may comprise the one or more addition inhibitors in an amount as little as 0.01 wt. %, 0.02 wt. %, 0.05 wt. %, 0.1 wt. %, 0.15 wt. %, as great as 0.2 wt. %, 0.25 wt. %, 0.3 wt. %, 0.5 wt. %, 1 wt. %, 3 wt. %, 5 wt. %, or within any range defined between any two of the foregoing values, based on the total weight of the TIM, such as 0.01 wt. % to 1 wt. %, 0.01 wt. % to 0.5 wt. %, or 0.01 wt. % to 3 wt. %, for example. In one exemplary embodiment, the TIM includes an addition inhibitor in the amount of 0.1 wt. %. In another exemplary embodiment, the TIM includes an addition inhibitor in the amount of 0.01 wt. %.

Without wishing to be held to any particular theory, it is believed that, in the absence of an addition inhibitor, the vinyl functional silicone oil reacts with the hydride functional silicone oil very quickly based on the addition hydrosilylation mechanism to form a solid phase that cannot be automatically dispensed by typical methods.

In one exemplary embodiment, the addition inhibitor is combined to functional silicone oils, such as KE-1056, KE-1151, KE-1820, KE-1825, KE-1830, KE-1831, KE-1833, KE-1842, KE-1884, KE-1885, KE-1886, FE-57, FE-61 available from Shin-Etsu, such as Syl-off® 7395, Syl-off® 7610, Syl-off® 7817, Syl-off® 7612, Syl-off® 7780 available from Dow Corning.

5. Coupling Agent

In an exemplary embodiment, the thermal gel includes one or more coupling agents that function to interact with both the filler and the polymer matrix of the silicone oils to promote a strong bond at the interface of the two materials. This helps to separate filler particle aggregates and disperse the filler particles into the polymer matrix. create better adhesion of thermally conductive filler(s) to the polyol polymer matrix. Exemplary coupling agents include silane coupling agents and organometallic compounds, such as include titanate coupling agents and zirconate coupling agents. Exemplary silane coupling agents include silane coupling agents with an aliphatic group. Exemplary coupling agents include titanium IV 2,2 (bis 2-propenolatomethyl)butanolato, tris(dioctyl)pyrophosphato-O; titanium IV 2-propanolato, tris(dioctyl)-pyrophosphato-O) adduct with 1 mole of diisooctyl phosphite; titanium IV bis(dioctyl)pyrophosphato-O, oxoethylenediolato, (Adduct), bis(dioctyl) (hydrogen)phosphite-O; titanium IV bis(dioctyl)pyrophosphato-O, ethylenediolato (adduct), bis(dioctyl)hydrogen phosphite; zirconium IV 2,2 (bis 2-propenolatomethyl)butanolato, tris(diisooctyl)pyrophosphato-O; zirconium IV 2,2-bis(2-propenolatomethyl) butanolato, cyclo di[2,2-(bis 2-propenolatomethyl) butanolato], pyrophosphato-O,O, and hexadecyltrimethoxysilane. In another exemplary embodiment, the coupling agent is KR-TTS available from Kenrich Chemical Company.

In some exemplary embodiments, the thermal gel comprises the one or more coupling agents in an amount as little as 0.1 wt. %, 0.2 wt. %, 0.3 wt. %, as great as 0.5 wt. %, 1.0 wt. %, 1.5 wt. %, 2.0 wt. %, or within any range defined between any two of the foregoing values, such as 0.1 wt. % to 2.0 wt. %, 0.2 wt. % to 1.5 wt. %, or 0.3 wt. % to 0.5 wt. %, for example, based on the total weight of the thermal interface material.

6. Crosslinker

In exemplary embodiments, the TIM includes a crosslinker to enable crosslinking between silicone oils. An exemplary crosslinker includes a hydrosilicone oil Exemplary crosslinkers include. Andisil XL-1B, Andisil XL-10, Andisil XL-11, Andisil XL 12, Andisil XL-13, and Andisil XL-17.

In some exemplary embodiments, the TIM comprises the one or more crosslinker in an amount as little as 0.10%, 0.20 wt. %, 0.30 wt. %, as great as 0.4 wt. %, 0.60 wt. %, 0.70 wt. %, 1.0 wt. %, or within any range defined between any two of the foregoing values, such as 0.10 wt. % to 1.0 wt. %, 0.20 wt. % to 0.70 wt. %, or 0.30 wt. % to 0.60 wt. %, for example, based on the total weight of the thermal gel.

7. Solvent

In exemplary embodiments, the TIM includes a solvent to increase the flowrate of the TIM. An exemplary solvent includes hydrocarbon solvents such as toluene, xylene, p-xylene, m-xylene, mesitylene, solvent naphtha H, solvent naphtha A, Isopar H and other paraffin oils and isoparaffinic fluids, alkanes, such as pentane, hexane, isohexane, heptane, nonane, octane, dodecane, 2-methylbutane, hexadecane, tridecane, pentadecane, cyclopentane, 2,2,4-trimethylpentane, petroleum ethers, halogenated hydrocarbons, such as chlorinated hydrocarbons, nitrated hydrocarbons, benzene, 1,2-dimethylbenzene, 1,2,4-trimethylbenzene, mineral spirits, kerosene, isobutylbenzene, methylnaphthalene, ethyltoluene, ligroin.

Exemplary solvents have a boiling point temperature as little as 60° C., 90° C., 110° C., as great as 130° C., 180° C., 220° C. or within any range defined between any two of the foregoing values, such as 60° C. to 220° C., 90° C. to 180° C., or 110° C. to 130° C., for example.

Exemplary solvents have a viscosity as little as 0.2 cSt, 1 cSt, 2 cSt, as great as 5 cSt, 10 cSt, 50 cSt or within any range defined between any two of the foregoing values, such as 0.2 cSt to 50 cSt, 1 cSt to 10 cSt, or 2 cSt to 5 cSt, for example.

In some exemplary embodiments, the thermal interface material may comprise the one or more solvents in an amount as little as 0.1 wt. %, 0.2 wt. %, 0.3 wt. % as great as 5 wt. %, 10 wt. %, 20 wt. %, or within any range defined between any two of the foregoing values, such as 0.1 wt. % to 20 wt. %, 0.1 wt. % to 10 wt. %, or 0.1 wt. % to 5 wt. %, for example, based on the total weight of the formulation.

6. Exemplary formulations of the Thermal Interface Material

In a first non-limiting illustrative embodiment, the TIM includes a first low molecular silicone oil of as little as 2 wt. %, 3 wt. %, 4 wt. %, as great as 8 wt. %, 9 wt. %, 10 wt. % or within any range defined between any two of the foregoing values, such as about 2 wt. % to about 10 wt. %, for example, a high molecular weight silicone oil of as little as 0.1 wt. %, 1 wt. %, 2 wt. %, as great as 3 wt. %, 4 wt. %, 5 wt. % or within any range defined between any two of the foregoing values, such as about 0.1 wt. % to about 5 wt. %, for example, a coupling agent of as little as 0.1 wt. %, 1 wt. %, 2 wt. %, as great as 3 wt. %, 4 wt. %, 5 wt. % or within any range defined between any two of the foregoing values, such as about 0.1 wt. % to about 5 wt. %, for example, a crosslinker of as little as 0.1 wt. %, 0.2 wt. %, 0.3 wt. %, as great as 0.8 wt. %, 0.9 wt. %, 1.0 wt. % or within any range defined between any two of the foregoing values, such as about 0.1 wt. % to about 1 wt. %, for example, a catalyst of as little as 0.1 wt. %, 1 wt. %, 2 wt. %, as great as 3 wt. %, 4 wt. %, 5 wt. % or within any range defined between any two of the foregoing values, such as about 0.1 wt. % to about 5 wt. %, for example, an inhibitor of as little as 0.1 wt. %, 1 wt. %, 2 wt. %, as great as 3 wt. %, 4 wt. %, 5 wt. % or within any range defined between any two of the foregoing values, such as about 0.1 wt. % to about 5 wt. %, for example, a first thermally conductive filler of as little as 25 wt. %, 30 wt. %, 35 wt. %, as great as 40 wt. %, 45 wt. %, 50 wt. % or within any range defined between any two of the foregoing values, such as about 25 wt. % to about 50 wt. %, for example, a second thermally conductive filler of as little as 25 wt. %, 30 wt. %, 35 wt. %, as great as 40 wt. %, 45 wt. %, 50 wt. % or within any range defined between any two of the foregoing values, such as about 25 wt. % to about 50 wt. %, for example, a third thermally conductive filler of as little as 25 wt. %, 30 wt. %, 35 wt. %, as great as 40 wt. %, 45 wt. %, 50 wt. % or within any range defined between any two of the foregoing values, such as about 25 wt. % to about 50 wt. %, for example, and of a solvent of as little as 0.1 wt. %, 1 wt. %, 2 wt. %, as great as 3 wt. %, 4 wt. %, 5 wt. % or within any range defined between any two of the foregoing values, such as about 0.1 wt. % to about 5 wt. %, for example.

In a second non-limiting illustrative embodiment, the TIM includes a first low molecular silicone oil of as little as 0.1 wt. %, 1 wt. %, 2 wt. %, as great as 13 wt. %, 14 wt. %, 15 wt. % or within any range defined between any two of the foregoing values, such as about 0.1 wt. % to about 15 wt. %, for example, a high molecular weight silicone oil of as little as 0.1 wt. %, 1 wt. %, 2 wt. %, as great as 3 wt. %, 4 wt. %, 5 wt. % or within any range defined between any two of the foregoing values, such as about 0.1 wt. % to about 5 wt. %, for example, a first thermally conductive filler of as little as 25 wt. %, 30 wt. %, 35 wt. %, as great as 40 wt. %, 45 wt. %, 50 wt. % or within any range defined between any two of the foregoing values, such as about 25 wt. % to about 50 wt. %, for example, a second thermally conductive filler of as little as 25 wt. %, 30 wt. %, 35 wt. %, as great as 40 wt. %, 45 wt. %, 50 wt. % or within any range defined between any two of the foregoing values, such as about 25 wt. % to about 50 wt. %, for example, a third thermally conductive filler of as little as 25 wt. %, 30 wt. %, 35 wt. %, as great as 40 wt. %, 45 wt. %, 50 wt. % or within any range defined between any two of the foregoing values, such as about 25 wt. % to about 50 wt. %, for example, an addition inhibitor of as little as 0.1 wt. %, 1 wt. %, 2 wt. %, as great as 3 wt. %, 4 wt. %, 5 wt. % or within any range defined between any two of the foregoing values, such as about 0.1 wt. % to about 5 wt. %, for example, an addition catalyst of as little as 0.1 wt. %, 1 wt. %, 2 wt. %, as great as 3 wt. %, 4 wt. %, 5 wt. % or within any range defined between any two of the foregoing values, such as about 0.1 wt. % to about 5 wt. %, for example, and a crosslinker or within any range defined between any two of the foregoing values, such as about 0.1 wt. % to about 1 wt. %, for example.

7. Exemplary Properties of the Thermal Interface Material

In some exemplary embodiments, a thermal interface material as described above has excellent resistance to oil bleeding while increasing the flow rate of the TIM. Oil bleeding is the distance of oil leakage from the TIM and is typically understood to be inversely related to the viscosity of the thermal interface material. That is, greater the viscosity of the TIM generally relates to a lower oil bleeding of the TIM.

Exemplary thermal interface materials are curable to form a solid pad for use with electronic components. Exemplary thermal interface materials have a cure time at room temperature of as little as 1 hour, 5 hours, 24 hours, as great as 2 days, 3 days, 5 days, or within any range defined between any two of the foregoing values such as between 1 hour and 5 days, between 5 hours and 3 days, or between 24 hours and 1 days, for example. A higher temperature will accelerate the curing time of the exemplary thermal interface materials. For example, when the ambient temperature is 100° C., the curing time for the exemplary thermal interface material is between 1 minute and 30 minutes.

Exemplary thermal interface materials have a thickness of as little as 0.03 mm, 0.05 mm, 0.07 mm, as great as 0.1 mm, 0.5 mm. 1 mm, or within any range defined between any two of the foregoing values, such as 0.03 mm to 1 mm, 0.05 mm to 0.5 mm, or 0.07 mm to 0.1 mm, for example Exemplary thermal interface materials without the added solvent as described above have a viscosity of as little as 1000 Pa.s, 1500 Pa.s, 2000 Pa.s, as great as 2500 Pa.s, 3000 Pa.s, 3500 Pa.s, or within any range defined between any two of the foregoing values such as between 1000 Pa.s and 3500 Pa.s, between 1500 Pa.s and 3000 Pa.s, or between 2000 Pa.s and 2500 Pa.s at 23° C. and a shear rate of $10\ s^{-1}$, for example.

Exemplary thermal interface materials with the added solvent as described above have a viscosity of as little as 150 Pa.s, 200 Pa.s, 250 Pa.s, 300 Pa.s, as great as 500 Pa.s, 550 Pa.s, 600 Pa.s, 650 Pa.s or within any range defined between any two of the foregoing values such as between 150 Pa.s and 650 Pa.s or between 200 Pa.s and 600 Pa.s at 25° C. and a shear rate of $10\ s^{-1}$.

Exemplary TIMs have a bleeding value of as little as 0.25 mm, 0.50 mm, 1.0 mm, as great as 1.25 mm, 1.40 mm. 1.50 mm, or within any range defined between any two of the foregoing values, such as 0.25 mm to 1.50 mm, 0.50 mm to 1.40 mm, or 1.0 mm to 1.25 mm, for example.

Exemplary TIMs have a flowrate of as little as 20 g/min, 25 g/min, 30 g/min, as great as 35 g/min, 40 g/min. 50 g/min, or within any range defined between any two of the foregoing values, such as 20 g/min to 50 g/min, 25 g/min to 40 g/min, or 30 g/min to 35 g/min, for example.

B. Methods of forming a Thermal Interface Material

In some exemplary embodiments, the TIM is prepared by combining the individual components with the exception of the solvent in a speed mixer and blending the composition together. The blended composition may then be applied directly to the substrate without baking.

Figure 4:
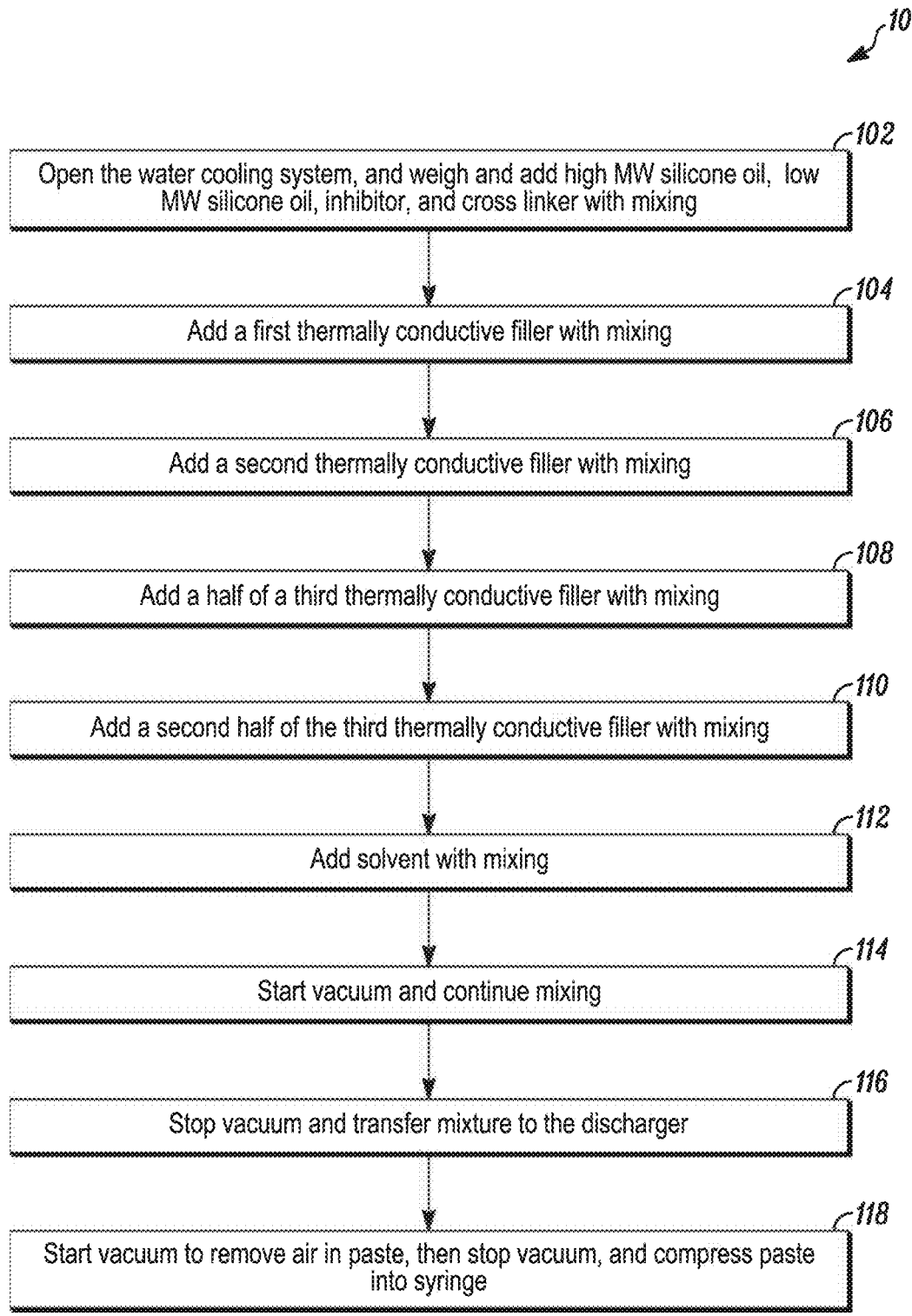
FIG. 4 is a flowchart illustrating a method of preparing a thermal interface material in accordance with the present disclosure.

More specifically, referring to FIG. 4, an exemplary method of forming a TIM 100 is shown. At step 102, a water cooling system/reaction vessel is opened and a high molecular weight silicone oil, low molecular silicone oil, inhibitor, catalyst and cross linker are added with mixing. In an exemplary embodiment, the mixture is mixed at 30 revolutions per minute (rpm) for 10 minutes. Then, at step 104, a first thermally conductive filler is added with mixing. In an exemplary embodiment, the mixture is mixed at 10 revolutions per minute (rpm) for 5 minutes. At step 106, a second thermally conductive filler is added with mixing. In an exemplary embodiment, the mixture is mixed at 10 revolutions per minute (rpm) for 10 minutes. At step 108, a portion of a third thermally conductive filler is added with mixing. In an exemplary embodiment, half of the third thermally conductive filler is added, and the mixture is mixed at 10 revolutions per minute (rpm) for 10 minutes. At step 110, a remaining portion of the third thermally conductive filler is added with mixing. In an exemplary embodiment, the second half of the third thermally conductive filler is added, and the mixture is mixed at 10 revolutions per minute (rpm) for 10 minutes and 54 rpm for 1 hour.

Figure 5:
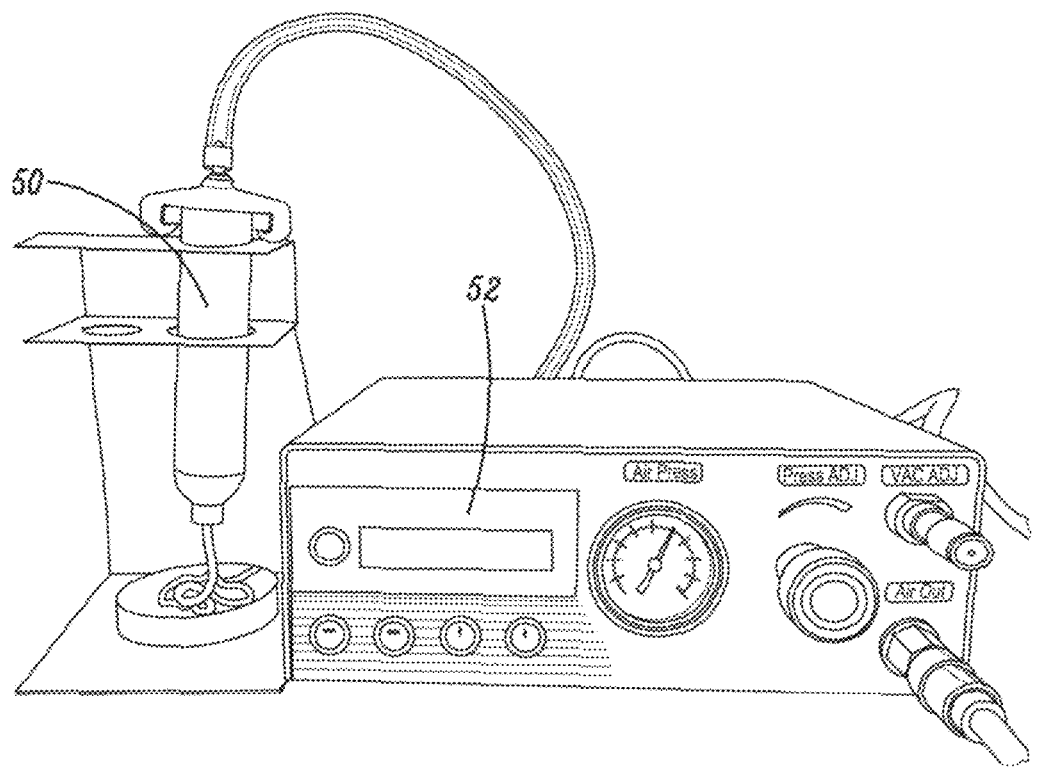
FIG. 5 shows a dispenser apparatus according to an embodiment of the present disclosure.

At step 112, solvent is added to the reaction vessel and mixing is continued. In an exemplary embodiment, half of the third thermally conductive filler is added, and the mixture is mixed at 10 revolutions per minute (rpm) for 30 minutes. At step 114, a vacuum of the reaction vessel is started and mixing is continued. In an exemplary embodiment, the mixture is mixed at 54 revolutions per minute (rpm) for 30 minutes. At step 116, the vacuum is stopped and the mixture is transferred to a discharger. Finally, at step 118, the vacuum is started to remove air in the TIM, and then the vacuum is stopped, and the resulting material is compressed into a syringe 50 (FIG. 5).

C. Applications Utilizing the Thermal Interface Material

Referring again to FIG. 1, in some exemplary embodiments, the thermal interface material is positioned as a TIM 18 between an electronic component 12 and a heat spreader 14, as indicated by TIM 18. In some exemplary embodiments, the thermal interface material is positioned as a TIM 2 between a heat spreader 14 and a heat sink 16, as indicated by TIM 20. In some exemplary embodiments, the thermal interface material is positioned as a TIM 1.5 (not shown) between an electronic component 12 and a heat sink 16.

EXAMPLES

Example 1

A thermal interface material (Example 1) was prepared according to the formulation provided in Table 1. The properties of Example 1 were then compared with those of a Comparative Example 1 (Comp. Ex. 1). Comp. Ex. 1 is also a silicone based TIM with $Al_2O_3$ filler and without complete cure.

TABLE 1

Formulations (wt. %) for Example 1

| Component | Wt % |
|---|---|
| Low MW silicone oil | 5.9 |
| High MW silicone oil | 1.5 |
| Silane coupling agent | 0.3 |
| Hydrosilicone oil | 0.6 |
| Addition Platinum catalyst | 0.3 |
| Addition inhibitor | 0.1 |
| Thermal conductive filler A | 30 |
| Thermal conductive filler B | 27 |
| Thermal conductive filler C | 34 |
| Volatile solvent | 0.3 |

In Example 1, the low molecular weight(MW) silicone oil was a low molecular weight liquid silicone oil with vinyl functional group. The molecular weight of the low MW silicone oil was below 50,000 Daltons. The high MW silicone oil had a molecular weight greater than 100,000 Daltons. The silane coupling agent used was hexadecyltrimethoxysilane.

Furthermore, the hydrosilicone oil was used as a cross linker, and the cross linker was Andisil XL 12 available from AB Specialty silicones Nantong Co., Ltd. The catalyst was an addition platinum catalyst was available from Wacker Chemie AG, and the addition inhibitor was a Pt Inhibitor 88 available from Wacker Chemie AG. The thermally conductive filler A comprised aluminum oxide particles having a particle diameter of about 10 microns. The thermally conductive filler B comprised aluminum oxide particles having a particle diameter of about 5 microns, and the thermally conductive filler C included aluminum oxide particles having a particle diameter of about 0.6 microns. The surface area of all particles in the thermally conductive fillers A-C was about 1.25 $m^2/g$. Finally, the solvent used was Isopar H available from Multisol limited.

To prepare the formulation of Example 1, the organic components with the exception of the volatile solvent were combined and blended with a speed mixer. The thermally conductive fillers were then added, and the mixture was subsequently blended. Finally, the volatile solvent was added and blended once more resulting in the formulation of Example 1.

The formulation was then filled into a 10 cubic centimeter syringe 50 (FIG. 5) that is connected to an automatic dispenser tool 52. The mixtures can be purged out of syringe 50 by air pressure generated by dispenser tool 52. Dispenser tool 52 also controls the orifice diameter. In effect, dispenser tool 52 controls the dispense rate of the mixtures from syringe 50 by varying the two parameters—orifice diameter and air pressure. The formulation dispensed under 0.6 Mpa pressure to test the flow rate.

To measure the flow rate of a TIM sample, a 30 cubic centimeter (cc) syringe 50 without a nozzle is used, and the TIM sample is dispensed via dispenser tool 52 for 1 minute under a pressure of 0.6 MPa. After 1 minute, the dispensed TIM sample is weighed. The measured flow rate of the Example 1 formulation was 31 g/min.

Figure 2:
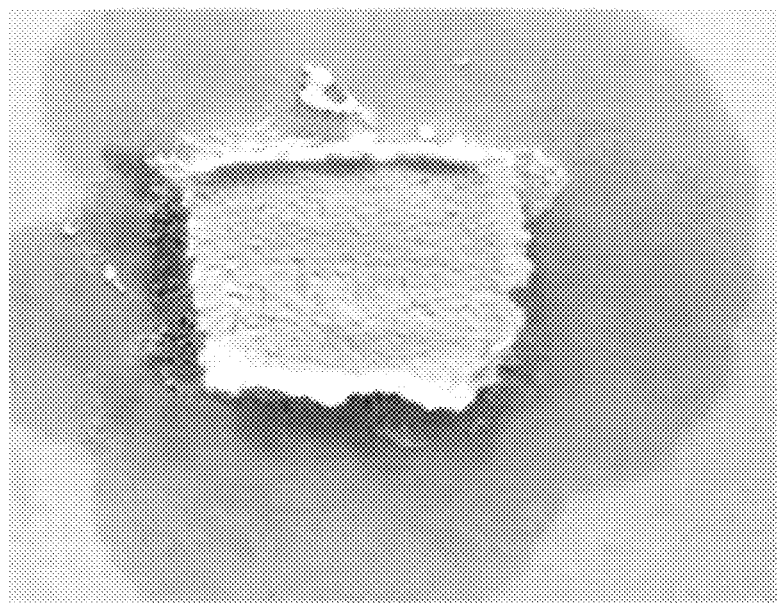
FIG. 2 is related to Comparative Example 1 in relation to an oil bleeding test and shows the sample formed from Comparative Example 1 after the oil bleeding test.
Figure 3A:
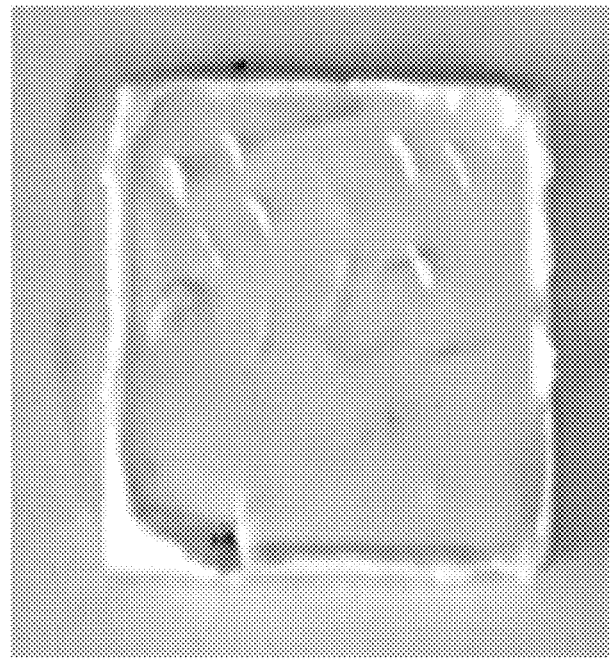
FIG. 3A is related to Example 1 and shows the sample formed from Example 1 after the oil bleeding test.
Figure 3B:
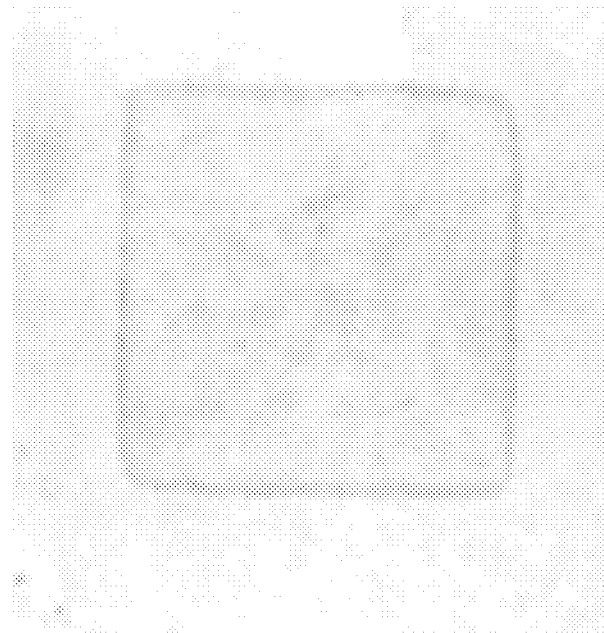
FIG. 3B is related to Example 1 and shows the back of the sample formed from Example 1 after the oil bleeding test.

The formulation was then printed as a gel onto a piece of A4 paper. The formulation's dimensions were 25.4 mm×25.4 mm×1.5 mm. The Ex. 1 formulation was then placed under room temperature until the oil bleeding from the formulation no longer expanded away from the formulation. Then, the distance from the formulation was measured to determine the distance of oil bleeding trace. As shown in FIGS. 3A and 3B, the oil bleeding trace of Ex. 1 is about 1.2 mm. By contrast, as shown in FIG. 2, the formulation of Comp. Ex. 1 had a bleeding trace greater than 3.5 mm.

Without wishing to be held to a particular theory, it is believed that the addition of higher surface area fillers reduce the bleeding of the TIM. These fillers also reduce the flowrate (i.e., increase the viscosity) of the TIM. However, the addition of the solvent serves to increase the flowrate of the TIM to increase the applicability of the TIM. In addition, the amount of solvent added is minimal (e.g., less than 0.5 wt. %) which prevents the solvent from impacting the advantageous benefit of reduced bleeding realized with the addition of high surface area fillers to the TIM.

Furthermore, oil bleeding is a slow process—it can be observed after at least 6 hours. By contrast, the volatility of the solvent used is high (i.e., the solvent evaporates quickly) such that the solvent completely evaporates during oil bleeding (e.g., in about 1 or 2 hours). Therefore, addition of the solvent increases the flow rate of the TIM when the TIM is dispensed, but once dispensed and after a period of time (e.g., about 2 hours), the solvent will completely evaporate from the TIM and will be unable to impact the oil bleeding properties of the TIM.

As used herein, the phrase "within any range defined between any two of the foregoing values" literally means that any range may be selected from any two of the values listed prior to such phrase regardless of whether the values are in the lower part of the listing or in the higher part of the listing. For example, a pair of values may be selected from two lower values, two higher values, or a lower value and a higher value.

While this invention has been described as having exemplary designs, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A thermal interface material comprising:
   a low molecular weight silicone oil having a weight ($M_w$) average molecular weight less than 50,000 Daltons;
   at least one thermally conductive filler having a surface area greater than 1.0 $m^2/g$, and a high molecular weight silicone oil present in an amount from 0.1 wt. % to 5 wt. %, based on a total weight of the thermal interface material, wherein the high molecular weight silicone oil comprises a vinyl functional silicone oil having a weight ($M_w$) average molecular weight of at least 60,000 Daltons, wherein the thermal interface material has a viscosity greater than 1500 Pa.s at 23° C.

2. The thermal interface material of claim 1, further including a solvent having a boiling point between 60° C. and 220° C.

3. The thermal interface material of claim 1, wherein the at least one thermally conductive filler includes a first thermally conductive filler, a second thermally conductive filler, and a third thermally conductive filler, wherein the first thermally conductive filer is a metal oxide having a surface area between 0.1 $m^2/g$ to 1.0 $m^2/g$, the second thermally conductive filler is a metal oxide having a surface area between 0.5 m²/g and 2.0 m²/g, and the third thermally conductive filler is a metal oxide having a surface area between 5.0 m²/g and 10.0 m²/g.

4. The thermal interface material of claim 3, wherein the first thermally conductive filler has an average particle size of at least 10 microns, the second thermally conductive filler has an average particle size between 1 micron and 10 microns, and the third thermally conductive filler has an average particle size less than 1 micron.

5. The thermal interface material of claim 1, wherein the thermal interface material comprises:
from 2 wt. % to 10 wt. % of the low molecular weight silicone oil;
from 50 wt. % to 95 wt. % of the at least one thermally conductive filler;
from 0.1 wt. % to 5 wt. % of a solvent;
from 0.1 wt. % to 5 wt. % of a coupling agent;
from 0.1 wt. % to 1 wt. % of a crosslinker;
from 0.1 wt. % to 5 wt. % of an inhibitor; and
from 0.1 wt. % to 5 wt. % of a catalyst.

6. The thermal interface material of claim 5, wherein the at least one thermally conductive filler includes:
from 25 wt. % to 50 wt. % of a first thermally conductive filler having a surface area between 0.1 m²/g to 1.0 m²/g;
from 25 wt. % to 50 wt. % of a second thermally conductive filler having a surface area between 0.5 m²/g and 2.0 m²/g; and
from 25 wt. % to 50 wt. % of a third thermally conductive filler having a surface area between 5.0 m²/g and 10.0 m²/g.

7. The thermal interface material of claim 4, further comprising a solvent having a boiling point between 60° C. and 220° C.

8. A thermal interface material comprising:
a low molecular weight silicone oil having a weight ($M_w$) average molecular weight less than 50,000 Daltons;
a first thermally conductive filler, a second thermally conductive filler, and a third thermally conductive filler, wherein the first thermally conductive filer is a metal oxide having a surface area between 0.1 m²/g to 1.0 m²/g, the second thermally conductive filler is a metal oxide having a surface area between 0.5 m²/g and 2.0 m²/g, and the third thermally conductive filler is a metal oxide having a surface area between 5.0 m²/g and 10.0 m²/g; and
a high molecular weight silicone oil, wherein the high molecular weight silicone oil comprises a vinyl functional silicone oil having a weight ($M_w$) average molecular weight of at least 60,000 Daltons; and
a solvent having a boiling point between 60° C. and 220° C.

9. The thermal interface material of claim 8, wherein the thermal interface material comprises:
from 2 wt. % to 10 wt. % of the low molecular weight silicone oil;
from 25 wt. % to 50 wt. % of a first thermally conductive filler having a surface area between 0.1 m²/g to 1.0 m²/g;
from 25 wt. % to 50 wt. % of a second thermally conductive filler having a surface area between 0.5 m²/g and 2.0 m²/g; and
from 25 wt. % to 50 wt. % of a third thermally conductive filler having a surface area between 5.0 m²/g and 10.0 m²/g;
from 0.1 wt. % to 5 wt. % of the high molecular weight silicone oil;
from 0.1 wt. % to 5 wt. % of a solvent;
from 0.1 wt. % to 5 wt. % of a coupling agent;
from 0.1 wt. % to 1 wt. % of a crosslinker;
from 0.1 wt. % to 5 wt. % of an inhibitor; and
from 0.1 wt. % to 5 wt. % of a catalyst.

10. The thermal interface material of claim 8, wherein the low molecular weight silicone oil comprises a vinyl functional silicone oil and the high molecular weight silicone oil is a vinyl silicone oil having a kinematic viscosity from 100,000 cSt to 10,000,00 cSt as measured in accordance with ASTM D445.

11. The thermal interface material of claim 8, wherein the first thermally conductive filler has an average particle size of at least 10 microns, the second thermally conductive filler has an average particle size between 1 micron and 10 microns, and the third thermally conductive filler has an average particle size less than 1 micron.

12. The thermal interface material of claim 8, wherein the thermal interface material has a bleeding trace value of between 1 mm and 5 mm and a flowrate between 20 g/min and 50 g/min.

13. The thermal interface material of claim 8, wherein the thermal interface material has a viscosity between 150 Pa.s and 650 Pa.s at 25° C.

14. An electronic component comprising:
a heat sink;
an electronic chip;
a thermal interface material positioned between the heat sink and electronic chip, the thermal interface material including:
a low molecular weight silicone oil having a weight ($M_w$) average molecular weight less than 50,000 Daltons;
at least one thermally conductive filler having a surface area greater than 1.0 m²/g; and
a high molecular weight silicone oil present in an amount from 0.1 wt. % to 5 wt. %, based on a total weight of the thermal interface material, wherein the high molecular weight silicone oil comprises a vinyl functional silicone oil having a weight ($M_w$) average molecular weight of at least 60,000 Daltons, wherein the thermal interface material has a viscosity greater than 1500 Pa.s at 23° C.

15. The electronic component of claim 14, further including a solvent having a boiling point between 60° C. and 220° C.

16. The electronic component of claim 15, wherein the at least one thermally conductive filler includes a first thermally conductive filler, a second thermally conductive filler, and a third thermally conductive filler, wherein the first thermally conductive filer is a metal oxide having a surface area between 0.1 m²/g to 1.0 m²/g, the second thermally conductive filler is a metal oxide having a surface area between 0.5 m²/g and 2.0 m²/g, and the third thermally conductive filler is a metal oxide having a surface area between 5.0 m²/g and 10.0 m²/g.

17. The electronic component of claim 14, wherein the electronic component further comprises a heat spreader positioned between the heat sink and the electronic chip, wherein the first surface layer is in contact with a surface of the electronic chip and the second surface layer is in contact with the heat spreader.

18. The electronic component of claim 14, the electronic component further comprises a heat spreader positioned between the heat sink and the electronic chip, wherein the first surface layer is in contact with a surface of the heat spreader and the second surface layer is in contact with the heat sink.

* * * * *